United States Patent
Lin

(10) Patent No.: US 9,661,761 B2
(45) Date of Patent: May 23, 2017

(54) CARRIER SUBSTRATE AND MANUFACTURING METHOD THEREOF

(71) Applicant: Unimicron Technology Corp., Taoyuan (TW)

(72) Inventor: Chun-Ting Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 319 days.

(21) Appl. No.: 13/965,194

(22) Filed: Aug. 13, 2013

(65) Prior Publication Data
US 2014/0332252 A1    Nov. 13, 2014

(30) Foreign Application Priority Data

May 10, 2013    (TW) .............................. 102116745 A

(51) Int. Cl.
*H05K 3/46*    (2006.01)
*H05K 3/40*    (2006.01)
(Continued)

(52) U.S. Cl.
CPC ......... *H05K 3/4682* (2013.01); *H05K 3/4007* (2013.01); *H01L 24/16* (2013.01); *H01L 2224/16225* (2013.01); *H01L 2924/0132* (2013.01); *H01L 2924/0133* (2013.01); *H01L 2924/12042* (2013.01); *H05K 3/06* (2013.01); *H05K 2201/0367* (2013.01);
(Continued)

(58) Field of Classification Search
CPC ......... H05K 3/4682; H05K 2203/0369; H05K 3/0376; H05K 3/06; H05K 3/4007; H05K 2205/0369; H05K 2201/0979; H05K 2201/0367; H01L 2224/16225

USPC .......................................................... 174/251
See application file for complete search history.

(56) References Cited

U.S. PATENT DOCUMENTS 9,408,313 B2 *    8/2016    Lin ..................... H05K 3/4007
2011/0024180 A1 *    2/2011    Ko ..................... H05K 3/4007
                                                              174/263

(Continued)

FOREIGN PATENT DOCUMENTS

TW    M433634    7/2012

OTHER PUBLICATIONS

"Office Action of Taiwan Counterpart Application", issued on Oct. 15, 2014, p. 1-p. 4, in which the listed reference was cited.

*Primary Examiner* — Bilkis Jahan
*Assistant Examiner* — Nga Doan
(74) *Attorney, Agent, or Firm* — Jianq Chyun IP Office

(57) ABSTRACT

A carrier substrate includes an insulation layer, conductive towers and a circuit structure layer. A diameter of each of the conductive towers is increased gradually from a top surface to a bottom surface, and the conductive towers include first conductive towers and second conductive towers surrounding the first conductive towers. The circuit structure layer is disposed on the insulation layer and includes at least one dielectric layer, at least two circuit layers and first conductive vias. Each of the second conductive towers correspondingly connects to at least two of the first conductive vias, and each of the first conductive towers correspondingly connects to one of the first conductive vias. An interface exists between the first conductive vias and the first and the second conductive towers.

2 Claims, 28 Drawing Sheets

(51) Int. Cl.
*H05K 3/06* (2006.01)
*H01L 23/00* (2006.01)

(52) U.S. Cl.
CPC ............... *H05K 2201/0979* (2013.01); *H05K 2203/0369* (2013.01); *H05K 2203/0376* (2013.01)

(56) References Cited

U.S. PATENT DOCUMENTS

| | | | |
|---|---|---|---|
| 2012/0234589 A1* | 9/2012 | Furuichi | H05K 3/4682 174/261 |
| 2013/0001794 A1* | 1/2013 | Roy | H05K 3/4682 257/774 |
| 2014/0183912 A1* | 7/2014 | Markel | B60N 2/22 297/216.13 |

* cited by examiner

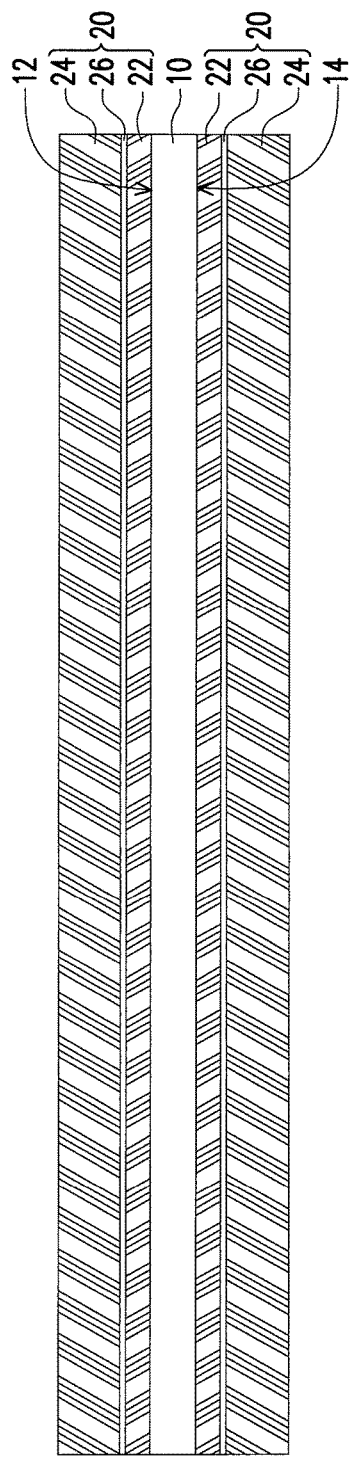
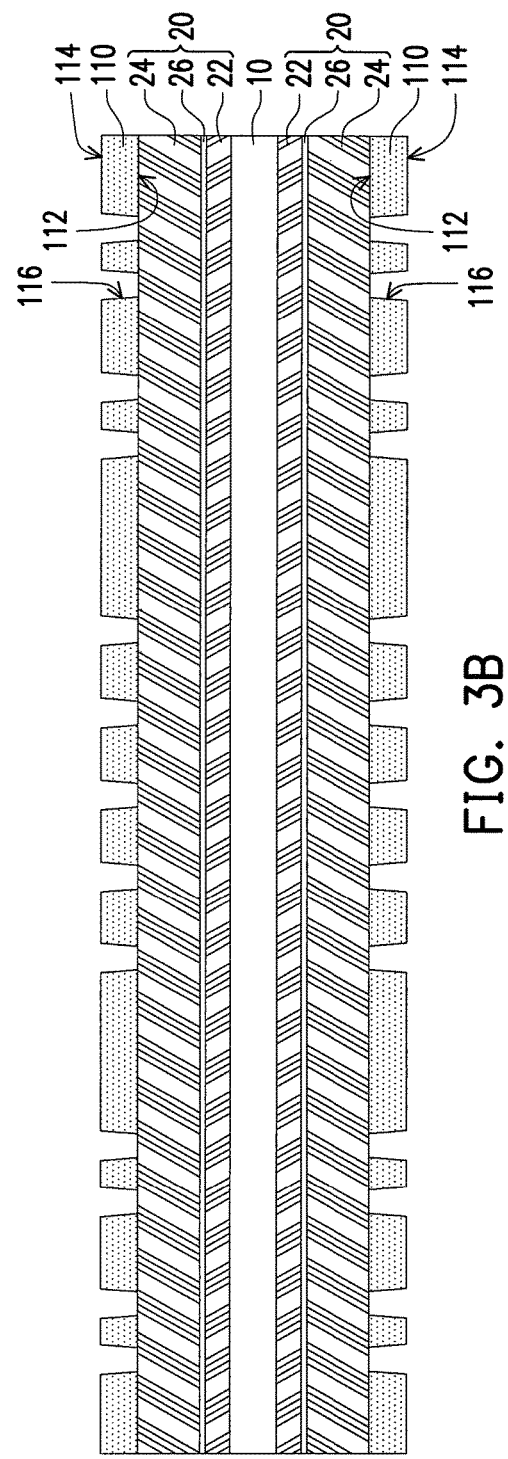
FIG. 3A
FIG. 3B

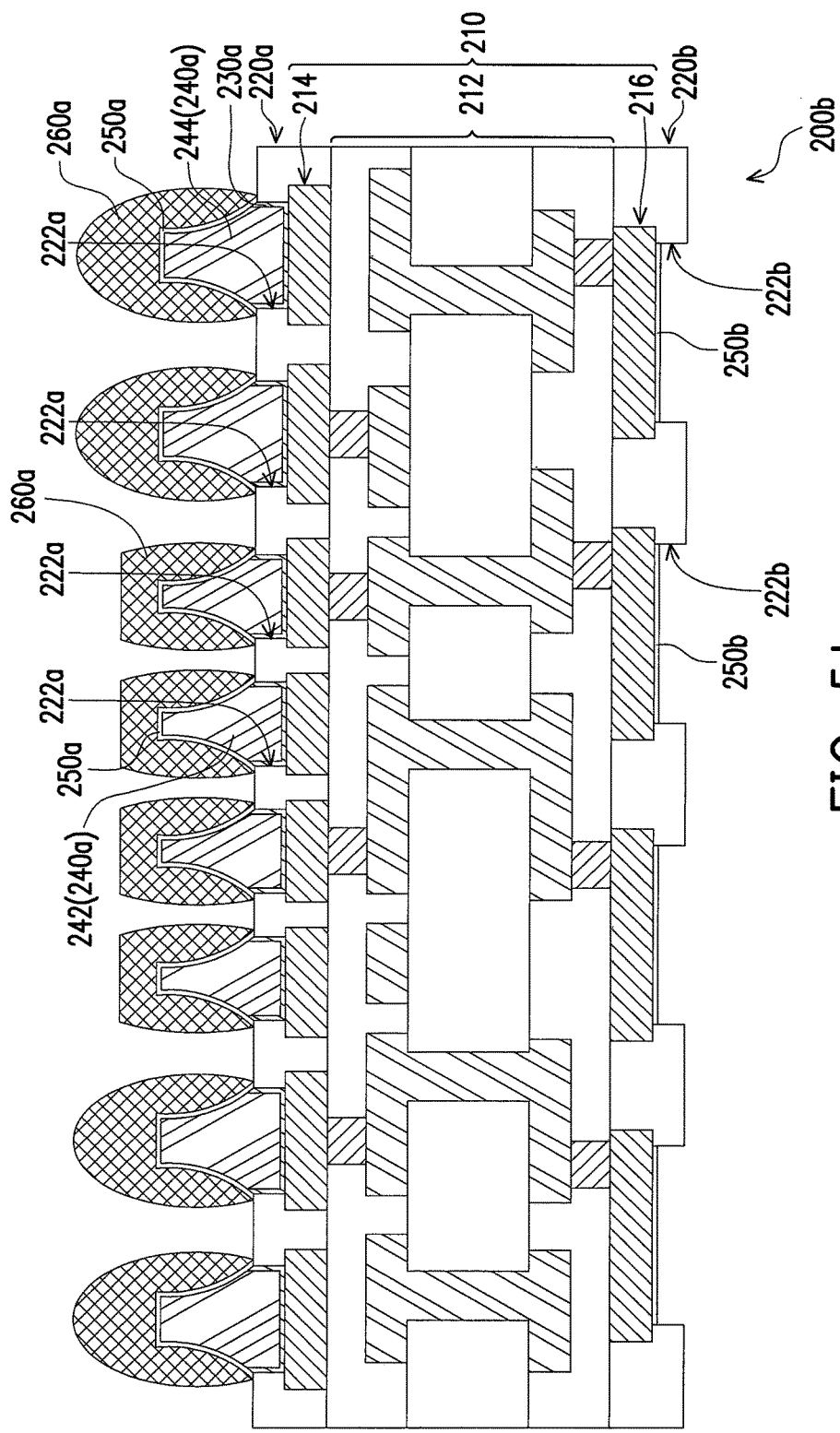

CARRIER SUBSTRATE AND MANUFACTURING METHOD THEREOF

CROSS-REFERENCE TO RELATED APPLICATION

This application claims the priority benefit of Taiwan application Ser. No. 102116745, filed on May 10, 2013. The entirety of the above-mentioned patent application is hereby incorporated by reference herein and made a part of this specification.

BACKGROUND OF THE INVENTION

Field of the Application

The invention is directed to a substrate and a manufacturing method thereof, and more particularly, to a carrier substrate adapted to carrying components and a manufacturing method thereof Description of Related Art In general, copper pillars connecting with a package body and copper pillars connecting with a chip are formed on a conventional carrier substrate by performing an electroplating process twice. However, since a plurality of independent copper pillars are formed on a circuit layer exposed by a patterned dry film by electroplating through the patterned dry film as an electroplating mask, the copper pillars formed are easily prone to have a poor height uniformity or coplanarity therebetween due to process variation. As a result, in the subsequent, when the carrier substrate is electrically connected with the package body and/or the chip through the copper pillars, a joining reliability between the copper pillars and the package body or the chip is reduced easily.

SUMMARY OF THE INVENTION

The invention provides a carrier substrate and a manufacturing method thereof, such that a conductive tower thereof has a favorable height uniformity or coplanarity.

The invention discloses a carrier substrate including an insulation layer, a plurality of conductive towers, a circuit structure layer and a solder resist layer. The insulation layer has a first surface and a second surface relative to each other and a plurality of first openings extending from the first surface to the second surface, wherein an aperture of each of the first openings gradually increases from the first surface of the insulation layer towards the second surface. The conductive towers are disposed on the first surface of the insulation layer. Each of the conductive towers has a top surface and a bottom surface relative to each other, and a diameter of each of the conductive towers gradually increases from the top surface towards the bottom surface. The conductive towers include a plurality of first conductive towers and a plurality of second conductive towers surrounding the first conductive towers, and a diameter of the second conductive towers is greater than a diameter of the first conductive towers. The circuit structure layer is disposed on the second surface of the insulation layer, and includes at least one dielectric layer, at least two circuit layers and a plurality of conductive vias. The dielectric layer and the circuit layers are alternately stacked. One of the circuit layers is disposed on the second surface of the insulation layer, the conductive vias include a plurality of first conductive vias extending from the circuit layers, disposed in the first openings and extending to the conductive towers, and the conductive vias further include a plurality of second conductive vias passing through the dielectric layer and electrically connecting the circuit layers. A diameter of first conductive vias gradually increases from the first surface of the insulation layer towards the second surface. Each of the second conductive towers correspondingly connects to at least two of the first conductive vias, and each of the first conductive towers correspondingly connects to one of the first conductive vias. An interface exists between the first conductive vias and the first conductive towers and the second conductive towers, cross-sectional profiles of the first conductive towers and the second conductive towers are concave shaped, and cross-sectional profiles of the first conductive vias are flat or convex shaped.

In an embodiment of the invention, a height of the first conductive towers is equal to or lower than a height of the second conductive towers.

The invention further discloses a carrier substrate including a circuit structure layer, a first solder resist layer, a second solder resist layer and a plurality of conductive towers. The circuit structure layer includes a core structure layer, a first circuit layer and a second circuit layer. The core structure layer has an upper surface and a lower surface relative to each other. The first circuit layer is disposed on the upper surface and exposes part of the upper surface. The second circuit layer is disposed on the lower surface and exposes part of the lower surface. The first solder resist layer is disposed on the first circuit layer and the upper surface exposed by the first circuit layer. The first solder resist layer has a plurality of first openings exposing a portion of the first circuit layer. The second solder resist layer is disposed on the second circuit layer and the lower surface exposed by the second circuit layer. The second solder resist layer has a plurality of second openings exposing a portion of the second circuit layer. The conductive towers are disposed at the first openings and higher than a surface of the first solder resist layer. The conductive towers are connected with the first openings exposed by the first circuit layer, wherein a diameter of each of the conductive towers gradually increases by a direction from away-from the first openings towards close-to the first openings. The conductive towers include a plurality of first conductive towers and a plurality of second conductive towers surrounding the first conductive towers, and a diameter of the second conductive towers is greater than the diameter of the first conductive towers.

In an embodiment of the invention, a height of the first conductive towers is equal to or lower than a height of the second conductive towers.

In an embodiment of the invention, a size of the first openings on the surface of the first solder resist layer is D, a height difference from a top surface of each of the conductive towers to the surface of the first solder resist layer is between ⅕D to ¾D, a width of the top surface of each of the conductive towers is between ⅓D to ¾D, and a height difference from a lower edge of each of the conductive towers exposed at each of the first openings to the surface of the first solder resist layer is between 0D to ⅓D.

The invention discloses a manufacturing method of the carrier substrate including the following processing steps. Copper foil structures are respectively pressed on an upper surface and a lower surface of a core dielectric layer that are relative of each other, wherein each of the copper foil structures includes a first copper foil layer, a release layer and a second copper foil layer, and a thickness of the first copper foil layer is smaller than a thickness of the second copper foil layer. The release layer is located between the first copper foil layer and the second copper foil layer, and the first copper foil layer is located on the upper surface and the lower surface of the core dielectric layer. Insulation layers are respectively formed on copper foil structures relative of each other, wherein each of the insulation layers has a first surface and a second surface relative to each other. A plurality of first openings extending from the first surface to the second surface is formed, and the first surface of each of the insulation layers is joined onto each of the second copper foil layers. First conductive structures respectively formed on the insulation layers relative of each other, wherein each of the first conductive structures includes a plurality of first conductive vias formed at the first openings and a first circuit layer formed on a portion of the second surfaces of the insulation layers. Built-up structures are respectively formed on the first circuit layers relative to each other and on another portion of the second surfaces of the insulation layers relative to each other. Each of the built-up structures includes at least one dielectric layer and a second conductive structure formed on the dielectric layer, wherein the second conductive structures at least includes a plurality of second conductive vias formed in the dielectric layer and extending to part of the first circuit layer and a second circuit layer formed on a portion of the dielectric layers. The first copper foil layers, the release layers, the core dielectric layer are removed to expose the second copper foil layers relative to each other. A patterned dry film is formed on each of the exposed second copper foil layers. By using the patterned dry film as an etching mask, each of the second copper foil layers is etched to form a plurality of conductive towers, wherein the conductive towers are formed on the first surface of each of the insulation layers. Each of the conductive towers has a top surface and a bottom surface relative to each other, and a diameter of each of the conductive towers gradually increases from the top surface towards the bottom surface. The conductive towers include a plurality of first conductive towers and a plurality of second conductive towers surrounding the first conductive towers. Each of the second conductive towers correspondingly connects to at least two of the first conductive vias, and each of the first conductive towers correspondingly connects to one of the first conductive vias. The patterned dry film is removed.

In an embodiment of the invention, the aforementioned manufacturing method further includes the following. After removing the first copper foil layers, the release layers, the core dielectric layer, and before forming the patterned dry film, a portion of each of the second copper foil layers is removed, so that each of the second copper foil layers has a first thickness and a second thickness, wherein the second thickness is larger than the first thickness. When forming the conductive towers, a height of the first conductive towers is equal to the first thickness, and a height of the second conductive towers is equal to the second thickness.

The invention further discloses a manufacturing method of the carrier substrate including the following steps. A circuit structure layer is provided. The circuit structure layer includes a core structure layer, a first circuit layer and a second circuit layer. The core structure layer has an upper surface and a lower surface relative to each other. The first circuit layer is disposed on the upper surface and exposes part of the upper surface. The second circuit layer is disposed on the lower surface and exposes part of the lower surface. A first solder resist layer and a second solder resist layer are respectively formed on the first circuit layer as well as the upper surface exposed by the first circuit layer and on the second circuit layer as well as the lower surface exposed by the second circuit layer. The first solder resist layer has a plurality of first openings exposing a portion of the first circuit layer, and the second solder resist layer has a plurality of second openings exposing a portion of the second circuit layer. A seed layer is formed on the first solder resist layer. The seed layer covers a surface of the first solder resist layer, inner walls of the first openings and the first circuit layer exposed by the first openings. An entire cover of metal layer is formed on the seed layer. A patterned dry film is formed on the entire cover of metal layer, and the patterned dry film exposes part of the entire cover of metal layer. By using the patterned dry film as an etching mask, the entire cover of metal layer is etched to form a plurality of conductive towers. The conductive towers are formed at the first openings and higher than the surface of the first solder resist layer. The conductive towers are connected with the first circuit layer exposed by the first openings. A diameter of each of the conductive towers gradually increases by a direction from away-from the first openings towards close-to the first openings. The conductive towers include a plurality of first conductive towers and a plurality of second conductive towers surrounding the first conductive towers, and a diameter of the second conductive towers is greater than a diameter of the first conductive towers. The patterned dry film and the seed layer located on the surface of the first solder resist layer are removed.

In an embodiment of the invention, the aforementioned manufacturing method further includes the following steps. Before forming the patterned dry film, a portion of the entire cover of metal layer, so that the entire cover of metal layer has a first thickness and a second thickness, wherein the second thickness is greater than the first thickness. When forming the conductive towers, a height of the first conductive towers is equal to the first thickness, and a height of the second conductive towers is equal to the second thickness.

In an embodiment of the invention, a size of each of the first openings on the surface of the first solder resist layer is D, a height difference from a top surface of each of the conductive towers to the surface of the first solder resist layer is between $\frac{1}{5}D$ to $\frac{3}{4}D$, a width of the top surface of each of the conductive towers is between $\frac{1}{5}D$ to $\frac{3}{4}D$, and a height difference from a lower edge of each of the conductive towers exposed by each of the first openings to the surface of the first solder resist layer is between $0D$ to $\frac{1}{3}D$.

According to the foregoing, the conductive towers of the invention are formed by using the patterned dry film as the etching mask to etch the second copper foil layers with uniform thickness. Therefore, the height of the conductive towers being formed has a favorable height uniformity or coplanarity. As a result, in the subsequent, when the carrier substrate of the invention is electrically connected to a package body and/or a chip through the conductive towers, the conductive towers may also have a favorable joining reliability with the package body and between copper pillars and the chip.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

FIG. 3A through FIG. 3J are schematic cross-sectional views illustrating the steps of a manufacturing method of a carrier substrate according to an embodiment of the invention.

FIG. 5A through FIG. 5J are schematic cross-sectional views illustrating the steps of a manufacturing method of a carrier substrate according to yet another embodiment of the invention.

DESCRIPTION OF EMBODIMENTS

Figure 1A:
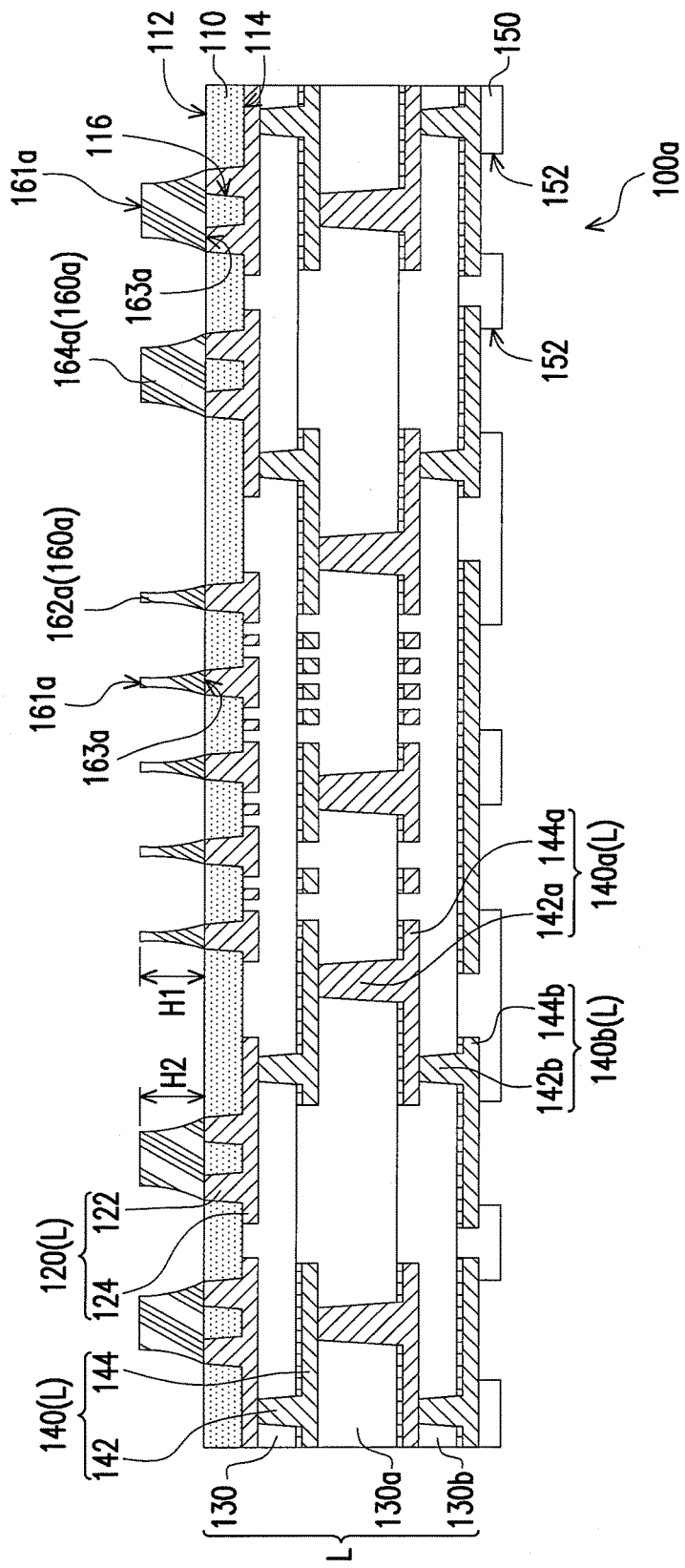
FIG. 1A is schematic cross-sectional view illustrating a carrier substrate according to an embodiment of the invention.

FIG. 1A is schematic cross-sectional view illustrating a carrier substrate according to an embodiment of the invention. Referring to FIG. 1A, in the present embodiment, the carrier substrate 100a includes an insulation layer 110, a circuit structure layer L, a solder resist layer 150 and a plurality of conductive towers 160a. In detail, the insulation layer 110 has a first surface 112 and a second surface 114 relative to each other and a plurality of first openings 116 extending from the first surface 112 to the second surface 114. Herein, as shown in FIG. 1A, an aperture of the first openings 116 of the present embodiment gradually increases from the first surface 112 of the insulation layer 110 towards the second surface 114. The conductive towers 160a are disposed on the first surface 112 of the insulation layer 110, wherein each of the conductive towers 160a has a top surface 161a and a bottom surface 163a relative to each other, and a diameter of each of the conductive towers 160a gradually increases from the top surface 161a towards the bottom surface 163a. The conductive towers 160a of the present embodiment include a plurality of first conductive towers 162a and a plurality of second conductive towers 164a surrounding the first conductive towers 162a, wherein a diameter of the second conductive towers 164a is greater than the diameter of the first conductive towers 162a. Herein, a height H1 of the first conductive towers 162a is substantially equal to a height H2 of the second conductive towers 164a.

The circuit structure layer L is disposed on the second surface 114 of the insulation layer 110, and includes at least one dielectric layer (three dielectric layers 130, 130a and 130b are illustrated in FIG. 1A), at least two circuit layers (four circuit layers 124, 144, 144a and 144b are illustrated in FIG. 1A) and a plurality of second conductive vias 142, 142a and 142b. The dielectric layers 130, 130a, 130b and the circuit layers 124, 144, 144a and 144b are alternately stacked. The second conductive vias 142, 142a and 142b pass through the dielectric layer 130, 130a and 130b and electrically connect the circuit layers 124, 144, 144a and 144b. One of the circuit layers 124, 144, 144a and 144b (viz., the circuit layers 124) is disposed on the second surface 114 of the insulation layer 110 and has a plurality of first conductive vias 122 disposed in the first openings 116 and extending to the conductive towers 160a. The first conductive vias 122 are disposed within the first openings 116 of the insulation layer 110, electrically connecting the circuit layers 124 and the first conductive towers 162a as well as electrically connecting the circuit layers 124 and the second conductive towers 164a. A diameter of the first conductive vias 122 gradually increases from the first surface 112 of the insulation layer 110 to the second surface 114. Particularly, in the present embodiment, each of the second conductive towers 164a correspondingly connects to at least two of the first conductive vias 122, and each of the first conductive towers 162a correspondingly connects to one of the first conductive vias 122. An interface exists between the first conductive vias 122 and the first conductive towers 162a and the second conductive towers 164a. Cross-sectional profiles of the first conductive towers 162a and the second conductive towers 164a are concave shaped, and cross-sectional profiles of the first conductive vias 122 are flat or convex shaped (not shown). Herein, the first conductive vias 122 and the circuit layers 124 are, for example, belonging to a same first conductive structure 120, and the second conductive vias 142, 142a and 142b respectively with the circuit layers 144, 144a and 144b are, for example, belonging to a same second conductive structure 140, 140a and 140b. The solder resist layer 150 is disposed on the circuit layer 144b of the circuit structure layer L and has a plurality of second openings 152 exposing parts of the circuit layers 144b.

Since the height H1 of the first conductive towers 162a and the height H2 of the second conductive towers 164a of the present embodiment have a favorable height uniformity or coplanarity, in the subsequent, when a chip (not shown) is electrically connected onto the first conductive towers 162a of the carrier substrate 100a of the present embodiment, or a package body (not shown) is electrically connected onto second conductive towers 164a, the first conductive towers 162a and the chip, or the second conductive towers 164a and the package body, may have favorable a joining reliability therebetween. In addition, since the diameter of each of the conductive towers 160a of the present embodiment gradually increases from the top surface 161a towards the bottom surface 163a, it results in a larger contact area and may provide a more adequate soldering space, and thus solders (not shown) subsequently formed on the conductive towers 160a may have favorable joining force.

It is noted that, although the circuit structure layer L mentioned herein has the three dielectric layers 130, 130a and 130b and the four circuit layers 124, 144, 144a and 144b, the present embodiment is not intended to limit a structure pattern of the circuit structure layer L. However, in other not shown embodiments, these of skilled in the art would be able to increase or decrease the layer numbers of the dielectric layer and the circuit layers according to the actual conditions, so as to comply with the process requirements; and it is not to be repeated herein.

Figure 1B:
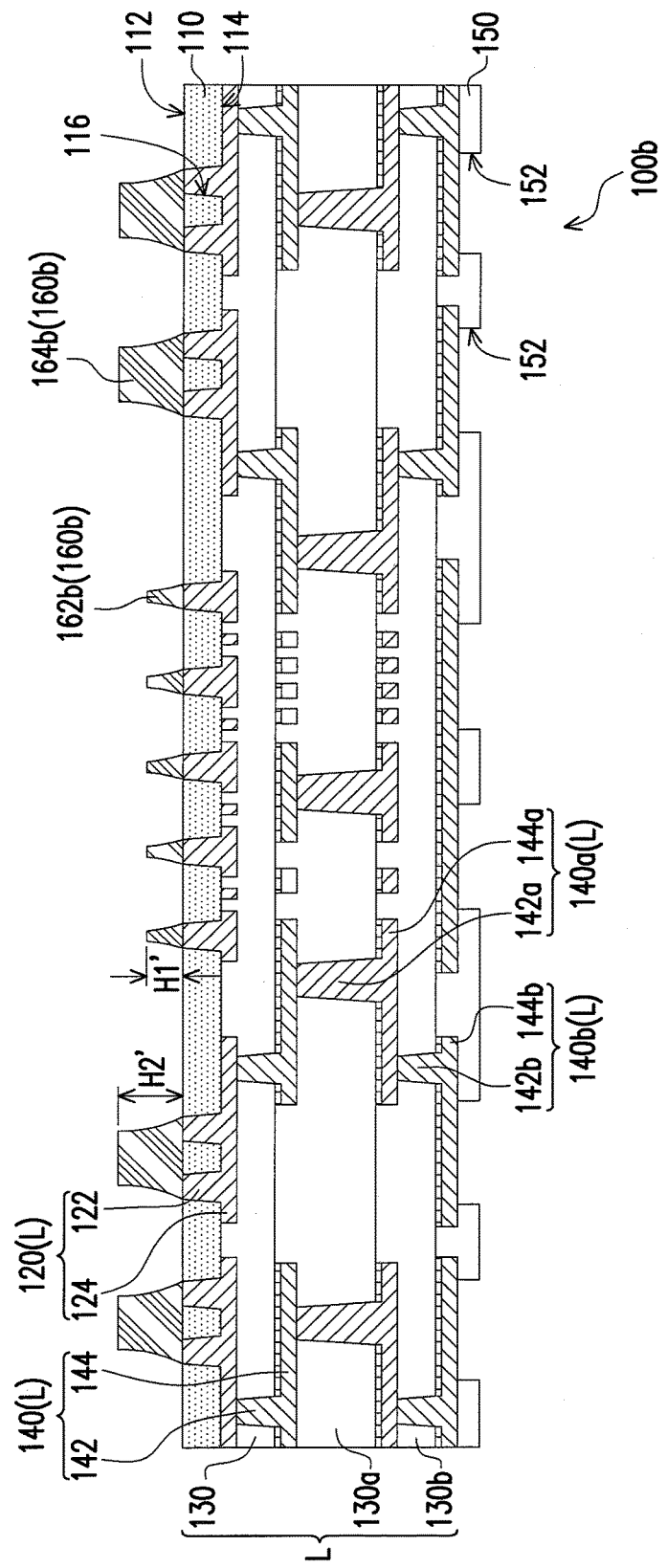
FIG. 1B is schematic cross-sectional view illustrating a carrier substrate according to another embodiment of the invention.

FIG. 1B is schematic cross-sectional view illustrating a carrier substrate according to another embodiment of the invention. The present embodiment has adopted component notations and part of the contents from the previous embodiment, wherein the same notations are used for representing the same or similar components, and descriptions of the same technical contents are omitted. The descriptions regarding to the omitted part may be referred to the previous embodiment, and thus is not repeated herein. Referring to FIG. 1B, a main difference between a carrier substrate 100b of the present embodiment and the carrier substrate 100a of the previous embodiment is that: a height H1' of first conductive towers 162b in conductive towers 160b of the present embodiment is substantially lower than a height H2' of second conductive towers 164b.

Figure 2A:
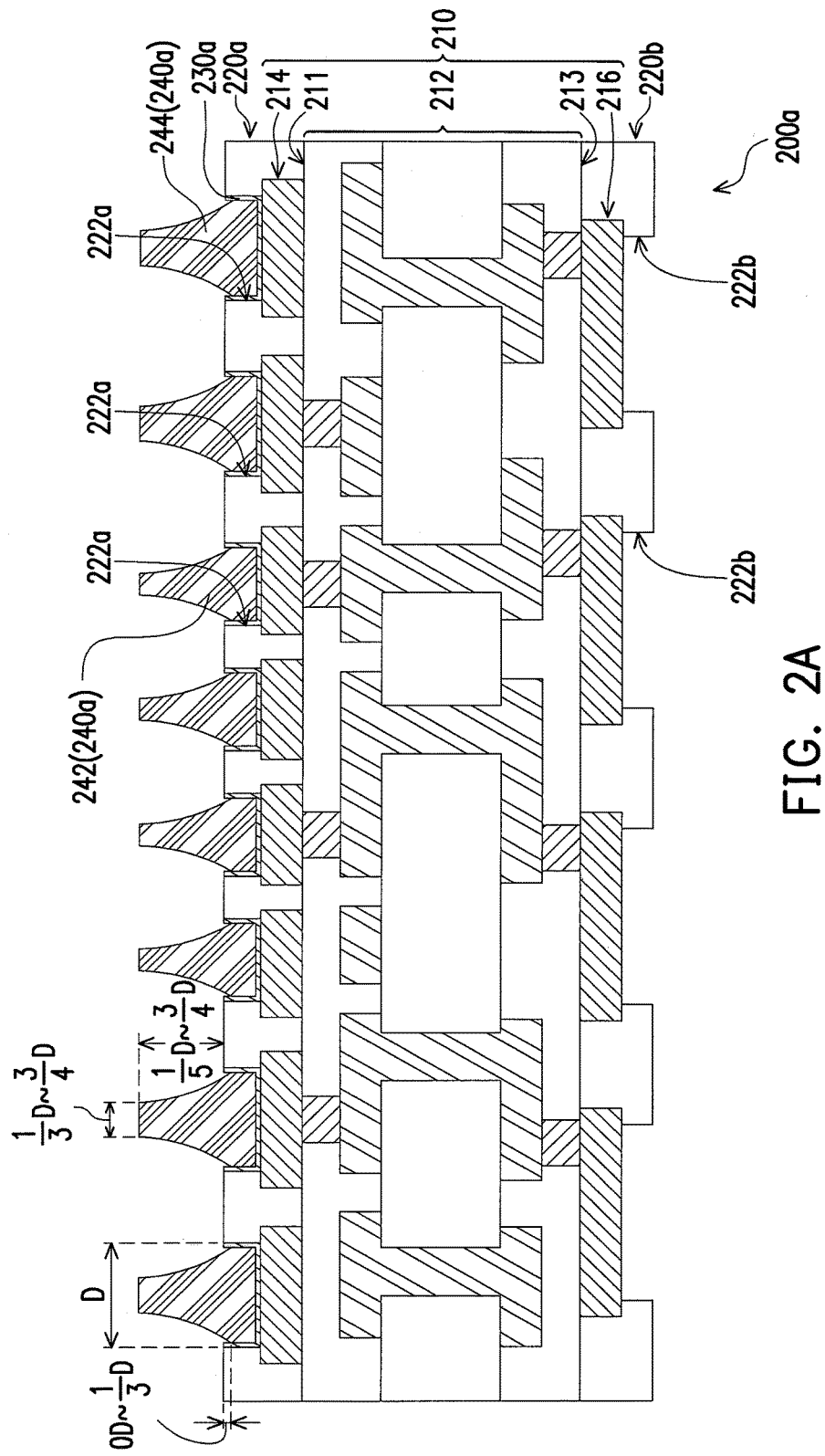
FIG. 2A is schematic cross-sectional view illustrating a carrier substrate according to yet another embodiment of the invention.

FIG. 2A is schematic cross-sectional view illustrating a carrier substrate according to yet another embodiment of the invention. Referring to FIG. 2A, in the present embodiment, a carrier substrate 200a includes a circuit structure layer 210, a first solder resist layer 220a, a second solder resist layer 220b and a plurality of conductive towers 240b. In detail, the circuit structure layer 210 includes a core structure layer 212, a first circuit layer 214 and a second circuit layer 216. The core structure layer 212 has an upper surface 211 and a lower surface 213 relative to each other. The first circuit layer 214 is disposed on the upper surface 211 and exposes part of the upper surface 211. The second circuit layer 216 is disposed on the lower surface 213 and exposes part of the lower surface 213. The first solder resist layer 220a is disposed on the first circuit layer 214 and the upper surface 211 exposed by the first circuit layer 214. The first solder resist layer 220a has a plurality of first openings 222a exposing a portion of the first circuit layer 214. The second solder resist layer 220b is disposed on the second circuit layer 216 and the lower surface 213 exposed by the second circuit layer 216. The second solder resist layer 220b has a plurality of second openings 222b exposing parts of the second circuit layer 216.

The conductive towers 240a are disposed at the first openings 222a of the first solder resist layer 220a and higher than a surface of the first solder resist layer 220a. The conductive towers 240a are connected with the first circuit layer 214 exposed by the first openings 222a, wherein a diameter of each of the conductive towers 240a gradually increases by a direction from away-from the first openings 222a towards close-to the first openings 222a. In the present embodiment, the conductive towers 240a include a plurality of first conductive towers 242 and a plurality of second conductive towers 244 surrounding the first conductive towers 242, wherein a height (not shown) of the first conductive towers 242 is equal to or lower than a height of the second conductive towers 244. A size of the first openings 222a at the surface of the first solder resist layer 220a is D, a height difference from the top surface of each of the conductive towers 240a to the first solder resist layer 220a is between ⅓D to ¾D, a width of the top surface of each of the conductive towers 240a is between ⅓D to ¾D, and a height difference from a lower edge of each of the conductive towers 240a exposed by each of the first openings 222a to the surface of the first solder resist layer 220a is between 0D to ⅓D.

Since the height of the first conductive towers 242 and the height of the second conductive towers 244 of the present embodiment both have a favorable height uniformity or coplanarity, in the subsequent, when a chip (not shown) is electrically connected onto the first conductive towers 242 of the carrier substrate 200a of the present embodiment, or a package body (not shown) is electrically connected onto second conductive towers 244, the first conductive towers 242 and the chip, or the second conductive towers 244 and the package body, may have favorable a joining reliability therebetween. In addition, since the diameter of each of the conductive towers 240a of the present embodiment gradually increases by the direction from away-from the first openings 222a towards close-to the first openings 222a, it results in a larger contact area and may provide a more adequate soldering space, and thus solders (not shown) subsequently formed on the conductive towers 240a may have favorable joining force.

Figure 2B:
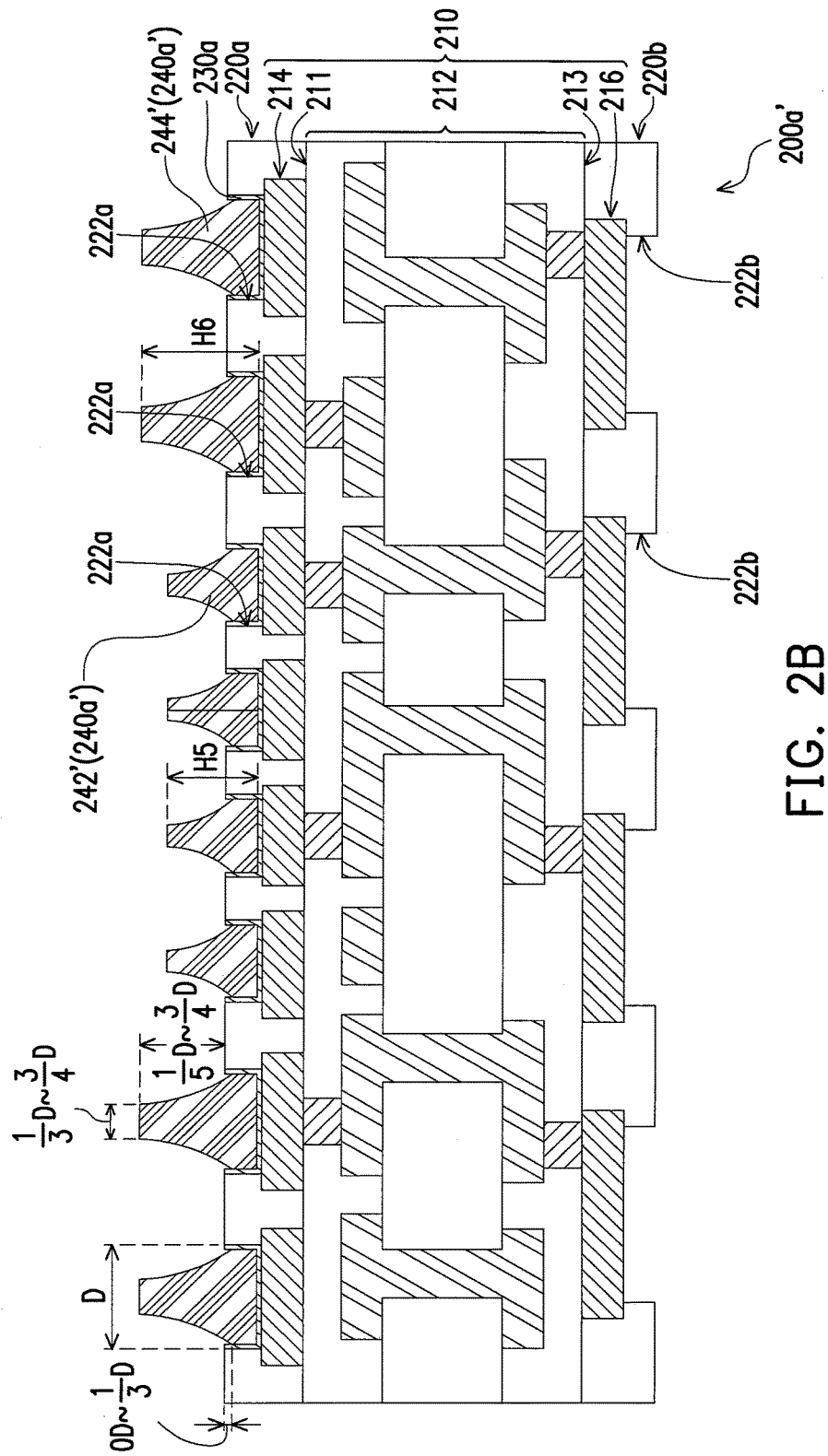
FIG. 2B is schematic cross-sectional view illustrating a carrier substrate according to still another embodiment of the invention.

FIG. 2B is schematic cross-sectional view illustrating a carrier substrate according to still another embodiment of the invention. The present embodiment has adopted component notations and part of the contents from the previous embodiments, wherein the same notations are used for representing the same or similar components, and descriptions of the same technical contents are omitted. The descriptions regarding to the omitted part may be referred to the previous embodiments, and thus is not repeated herein. Referring to FIG. 2B, a main difference between a carrier substrate 200a' of the present embodiment and a carrier substrate 200a of the previous embodiment is that: a height H5 of first conductive towers 242' of conductive towers 240a' of the present embodiment is substantially lower than a height H6 of second conductive towers 244' of the conductive towers 240a'.

Only the structures of the carrier substrates 100a, 100b and 200a of the invention have been described in the above, while manufacturing methods of the carrier substrates 100a, 100b and 200a of the invention have not yet been introduced. In this regard, multiple embodiments are taken as examples for explaining the manufacturing methods of the carrier substrates 100a, 100b, 100c, 100d, 200a, 200b and 200c, and the manufacturing method of the carrier substrate 100a, accompanied with FIG. 3A through FIG. 3J, FIG. 4A through FIG. 4C, FIG. 5A through FIG. 5J, and FIG. 6A through FIG. 6B, is going to be described in detail below.

Figure 3C:
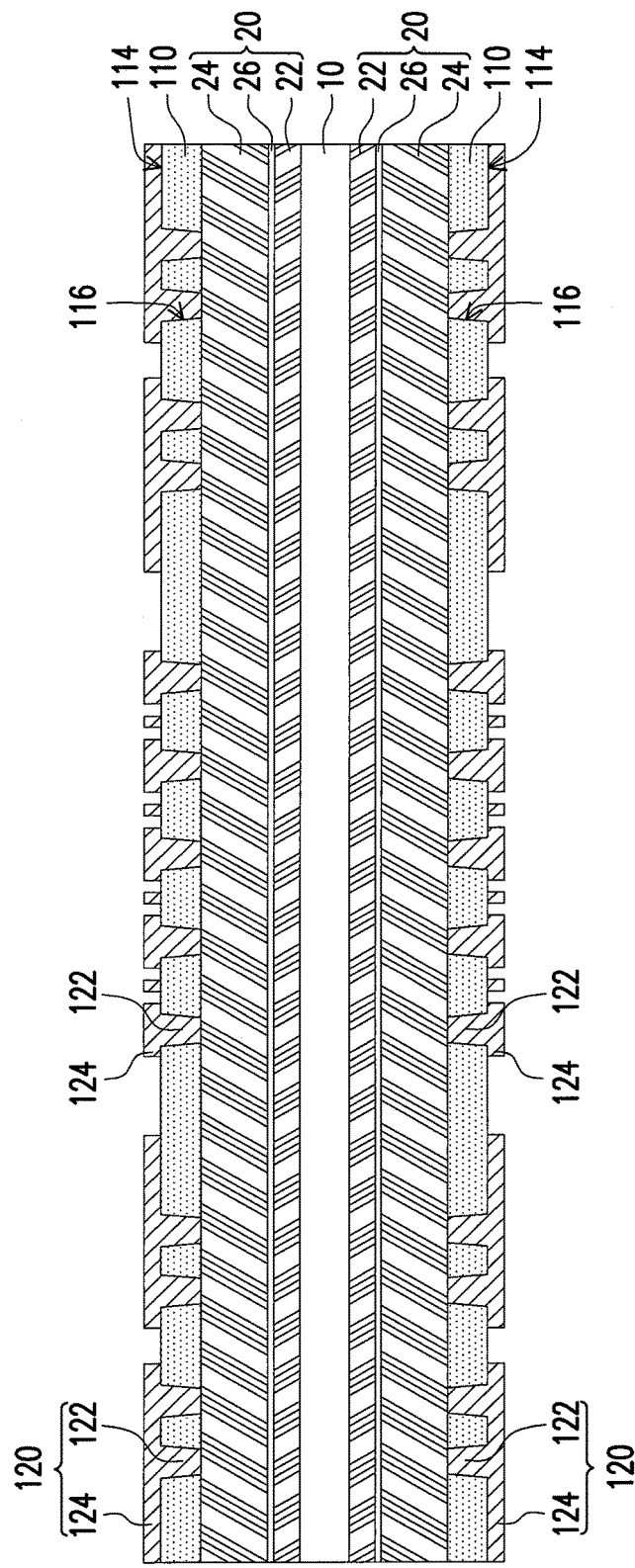

FIG. 3A through FIG. 3J are schematic cross-sectional views illustrating the steps of a manufacturing method of a carrier substrate according to an embodiment of the invention. Referring to FIG. 3A, according to the manufacturing method of the carrier substrate 100a of the present embodiment, firstly, copper foil structures 20 are respectively pressed on an upper surface 12 and a lower surface 14 of a core dielectric layer 10 that are relative to each other. In the present embodiment, each of the copper foil structures 20 include a first copper foil layer 22, a second copper foil layer 24 and a release layer 26, a thickness of the first copper foil layer 22 is smaller than a thickness of the second copper foil layer 24, wherein the release layer 26 is located between the first copper foil layer 22 and the second copper foil layer 24, and the first copper foil layer 22 is located on the upper surface 12 and the lower surface 14 of the core dielectric layer 10. Herein, the thickness of first copper foil layer 22, for example, is 18 microns, and the thickness of the second copper foil layer 24, for example, is 50 microns.

Next, referring to FIG. 3B, insulation layers 110 are respectively pressed on copper foil structures 20 relative to each other, wherein each of the insulation layers 110 has a first surface 112 and a second surface 114 relative to each other, and a plurality of first openings 116 extending from the first surface 112 to the second surface 114 are formed. In the present embodiment, an aperture of the first openings 116 gradually increases from the first surfaces 112 of the insulation layers 110 towards to the second surfaces 114. Herein, a material of the insulation layers 110, for example, is ABF (Ajinomoto Build-up Film) resin, and the insulation layers 110 are formed on the copper foil structures 20 via means of thermal pressing. In addition, the first openings 116, for example, are formed via laser drilling.

Next, referring to FIG. 3C, first conductive structures 120 are respectively formed on the insulation layers 110 relative to each other, wherein the first conductive structures 120 include a plurality of first conductive vias 122 formed at the first openings 116 and a first circuit layer 124 formed on a portion of the second surfaces 114 of the insulation layers 110. Herein, a method for forming the first conductive structure 120, for example, is electroplating.

Figure 3D:
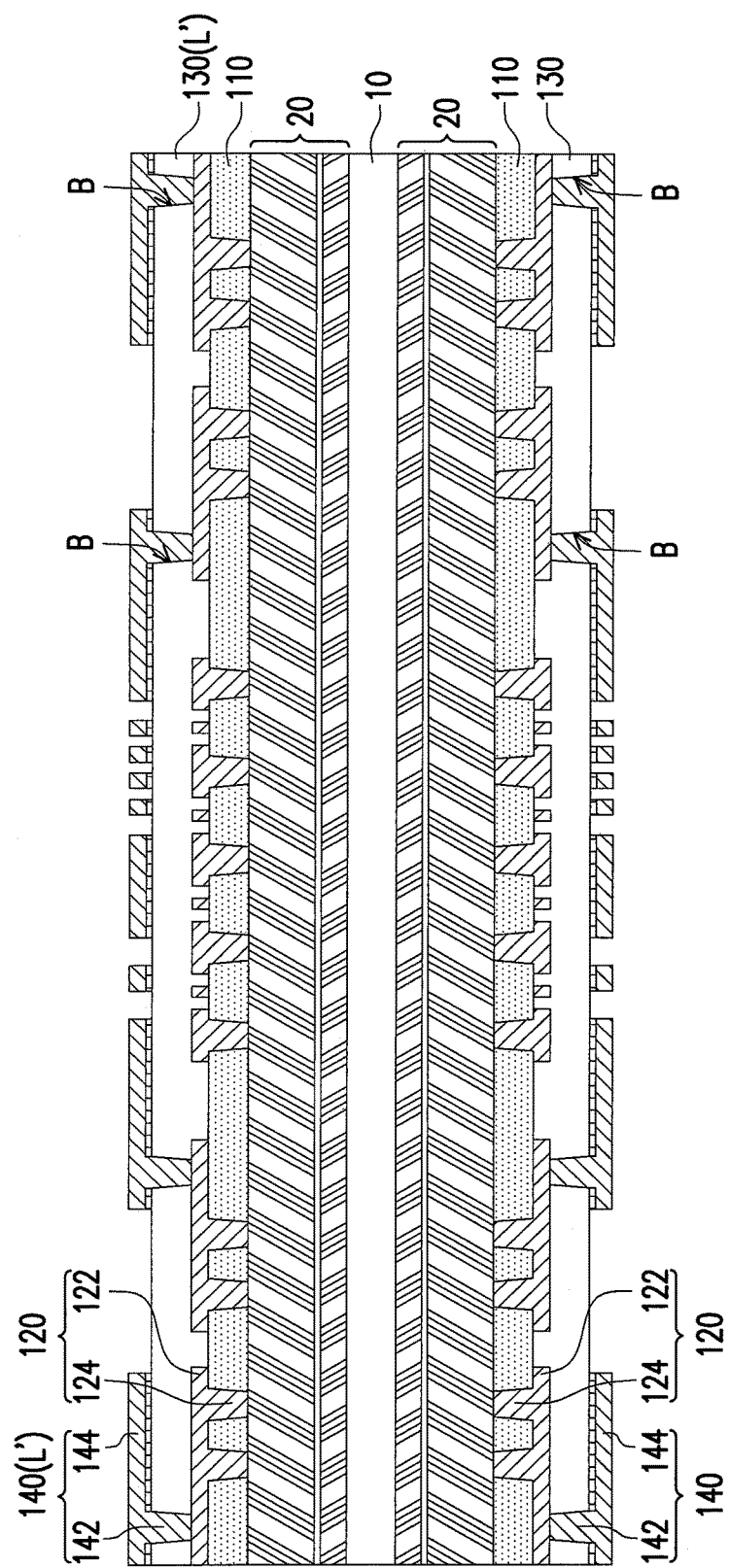

Next, referring to FIG. 3D, built-up structures L' are respectively formed on the first circuit layers 124 relative to each other and another portion of the second surfaces 114 of the insulation layers 110 relative to each other, and each of the built-up structures L' include at least one dielectric layer 130 and a second conductive structure 140 formed on the dielectric layer 130, wherein the second conductive structure 140 at least include a plurality of second conductive vias 142 formed in the dielectric layer 130 and extending to parts of the first circuit layer 124 and a second circuit layer 144 formed on a portion of the dielectric layer 130.

Figure 3E:
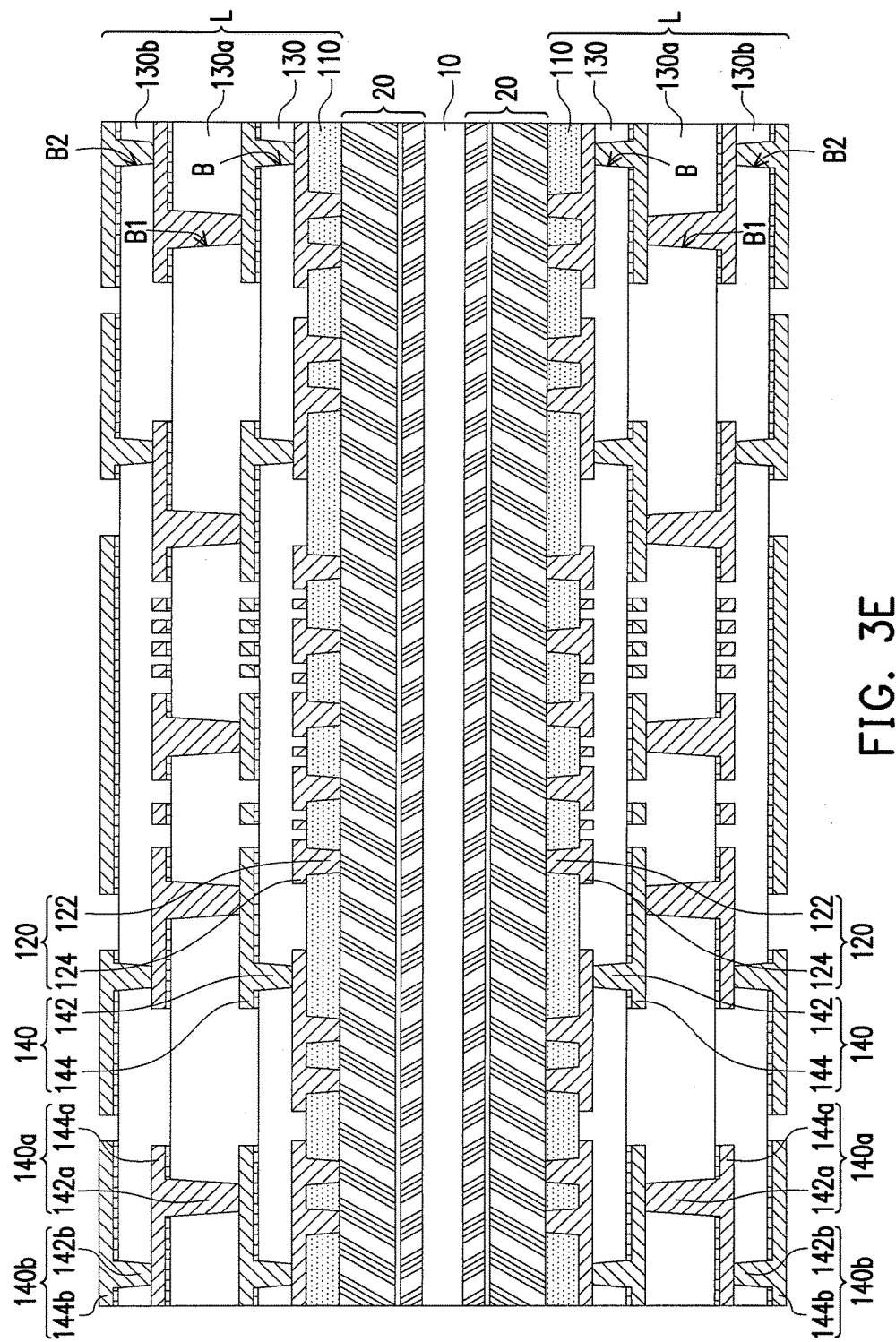

Next, referring to FIG. 3E, the step illustrated by FIG. 3D may selectively be repeated, so as to form the circuit structure layer L having three dielectric layers 130, 130a and 130b, four circuit layers 124, 144, 144a and 144b, the second conductive vias 142, 142a and 142b and the first conductive vias 122. As shown in FIG. 3E, the dielectric layers 130, 130a and 130b and the circuit layers 124, 144, 144a and 144b are alternately stacked. The second conductive vias 142, 142a and 142b pass through the dielectric layers 130, 130a and 130b and located within blind holes B, B1 and B2, wherein the second conductive vias 142, 142a and 142b and the circuit layers 124, 144, 144a and 144b are electrically connected. Herein, the second conductive vias 142a and 142b respectively with the second circuit layers 144a and 144b, for example, are belonging to the same second conductive structures 140a and 140b. In addition, when repeating the step illustrated by FIG. 3D, thickness of the dielectric layers 130a and 130b are not limited in the present embodiment.

Figure 3F:
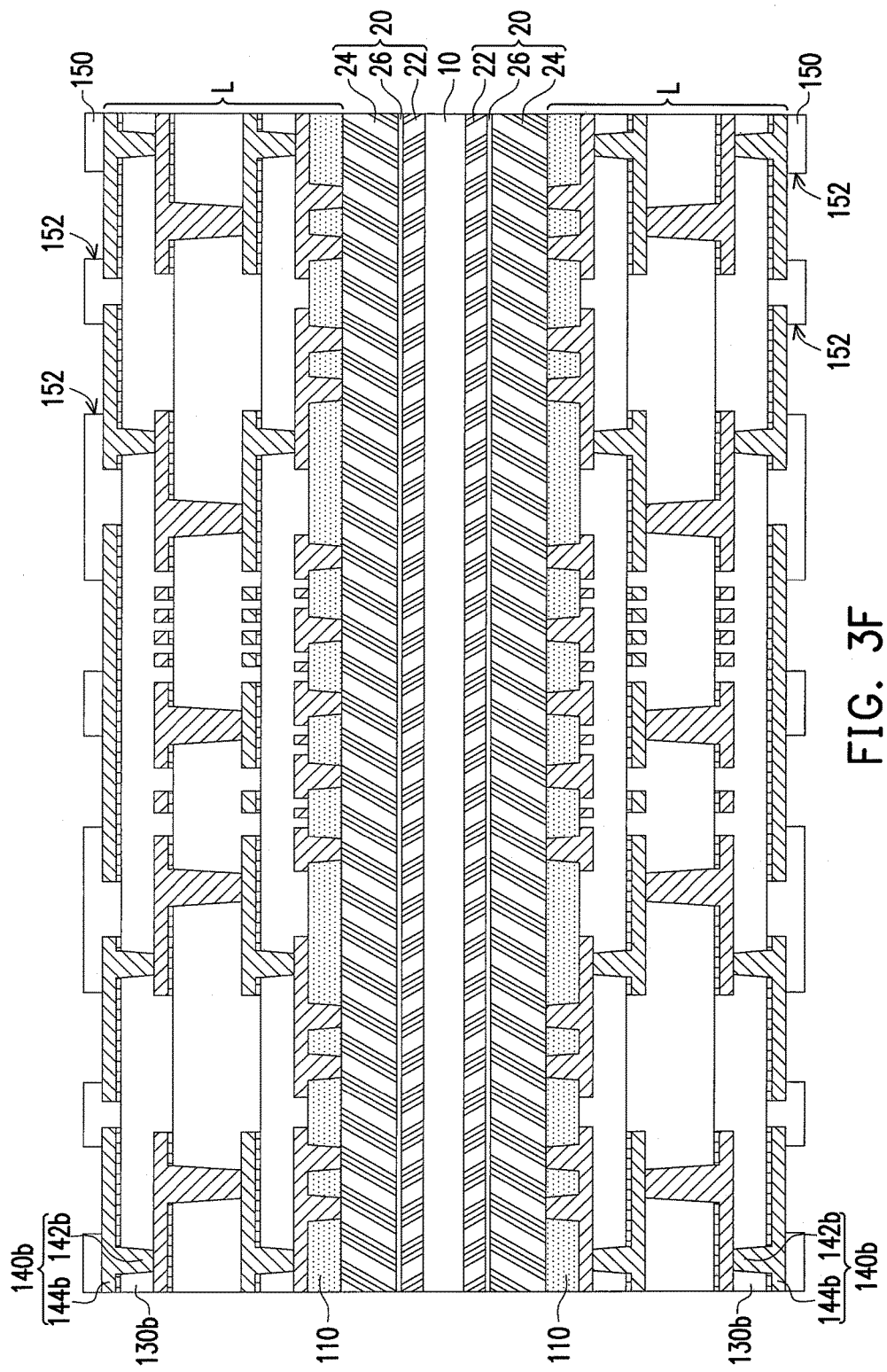

Next, referring to FIG. 3F, solder resist layers 150 are respectively formed on a portion of the dielectric layers 130b and covering a portion of the second circuit layers 144b, wherein the solder resist layers 150 have a plurality of second openings 152 exposing the another portion of the second circuit layers 144b.

Figure 3G:
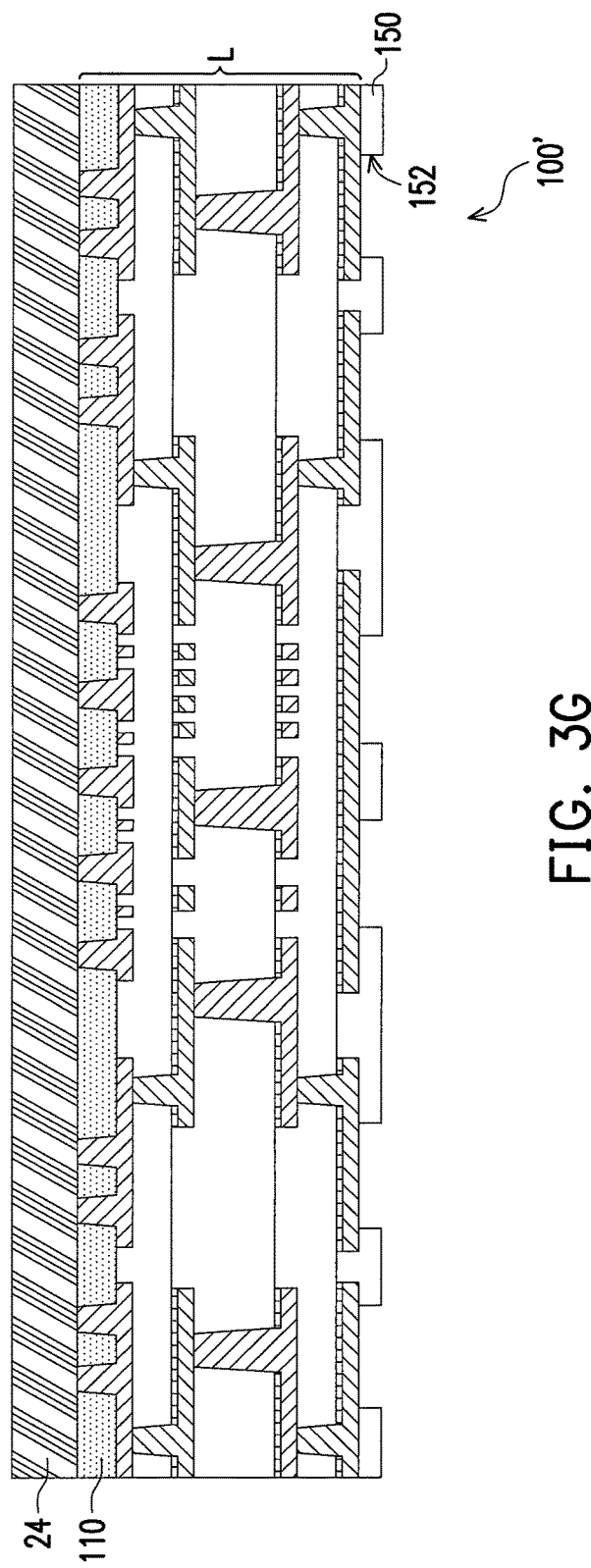
Figure 3H:
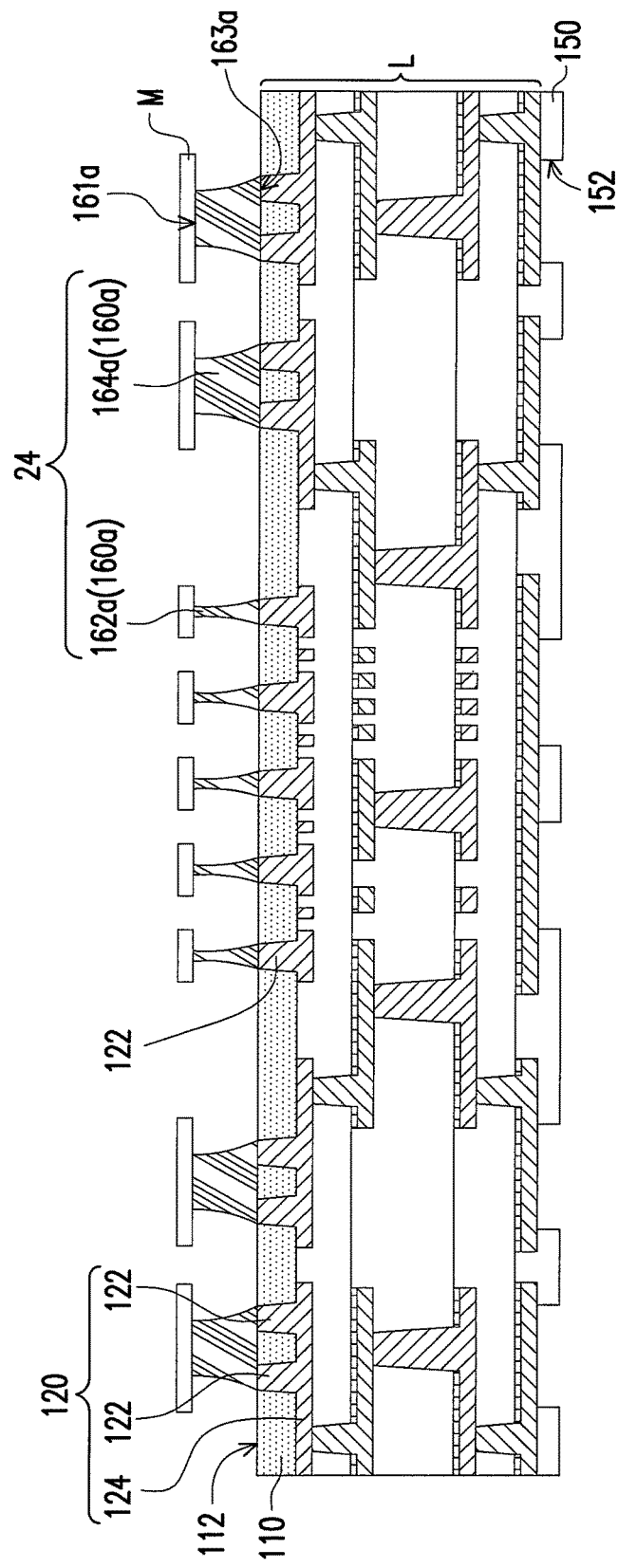
Figure 3I:
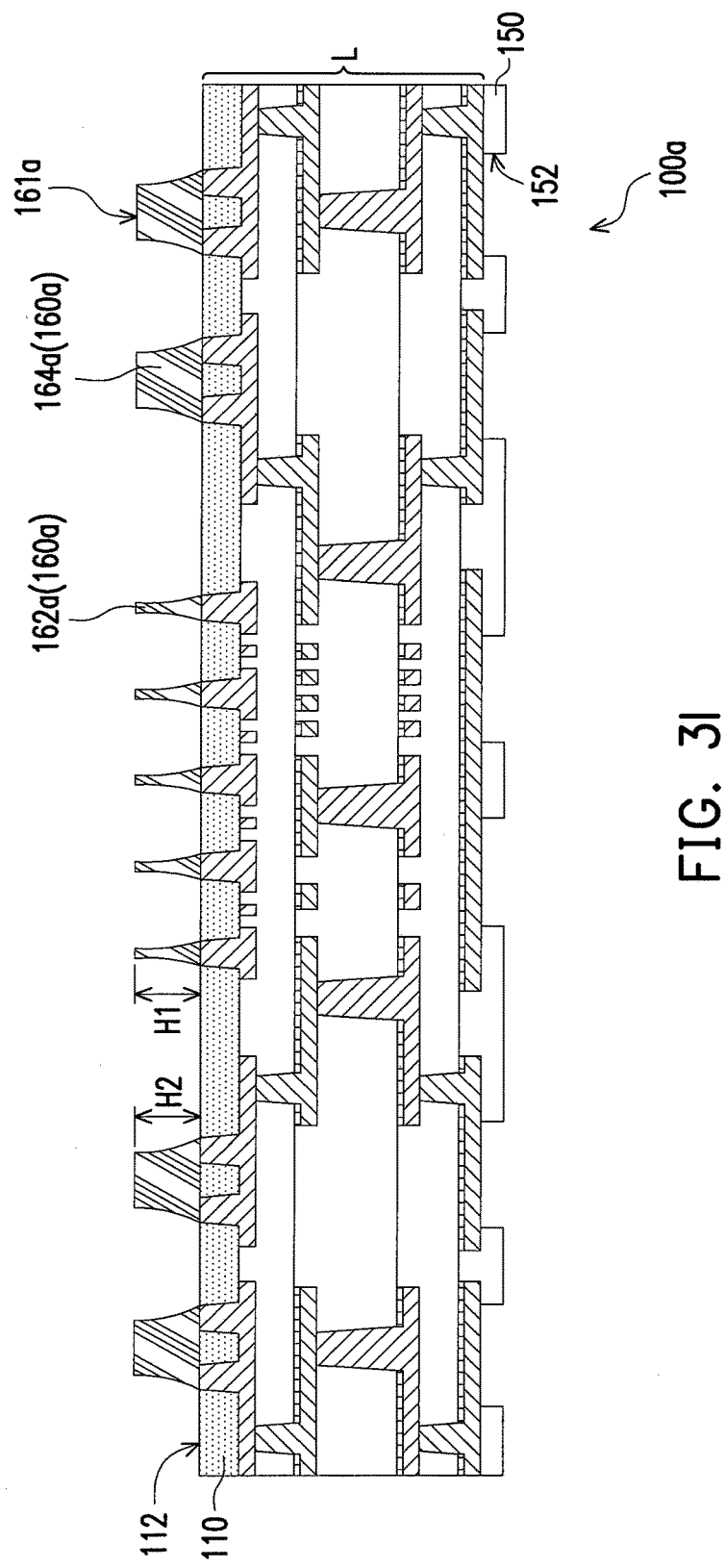

Next, referring to FIG. 3F and FIG. 3G at the same time, the first copper foil layers 22, the release layers 26 and the core dielectric layer 10 are removed to expose the second copper foil layers 24, so as to form two carrier substrate units 100' independent of each other (only one is illustrated in FIG. 3I).

Afterward, referring to FIG. 3H, a patterned dry film M is formed on the exposed second copper foil layer 24. Next, by using the patterned dry film M as an etching mask, the second copper foil layer 24 is etched to form the conductive towers 160a, wherein the conductive towers 160a are formed on the first surface 112 of the insulation layer 110.

More specifically, referring to FIG. 3H again, each of the conductive towers 160a have a top surface 161a and a bottom surface 163a relative to each other, and a diameter of each of the conductive towers 160a gradually increases from the top surface 161a toward the bottom surface 163a. In the present embodiment, the conductive towers 160a include the first conductive towers 162a and the second conductive towers 164a surrounding the first conductive towers 162a. In particular, in the present embodiment, each of the second conductive towers 164a correspondingly connects to at least two of the first conductive vias 122, and each of the first conductive towers 162a correspondingly connects to one of the first conductive vias 122. Since the conductive towers 160a of the present embodiment are formed by the second copper foil layers 24 etched with uniform thickness, instead of being formed by using the conventionally known electroplating process, an interface exists between the first conductive vias 122 and the first conductive towers 162a and the second conductive towers 164a of the present embodiment, cross-sectional profiles of the first conductive towers 162a and the second conductive towers 164a are concave shaped, and cross-sectional profiles of the first conductive vias 122 are flat or convex shaped (not shown).

Finally, referring to FIG. 3H and FIG. 3I at the same time, the patterned dry film M is removed to expose the top surfaces 161a of the conductive towers 160a. Now, as shown in FIG. 3I, a diameter of the second conductive towers 164a is greater than a diameter of the first conductive towers 162a. A height H1 of the first conductive towers 162a is substantially equal to a height H2 of the second conductive towers 164a. At this point, the manufacture of the carrier substrate 100a is completed.

Since the conductive towers 160a of the present embodiment is formed by etching the second copper foil layers 24, instead of being formed by using the conventionally known electroplating process, and the second copper foil layers 24 themselves have a favorable uniformity in thickness, then as in relative to copper pillars formed by the conventionally known electroplating process, the height of the conductive towers 160a formed in the present embodiment may have a more favorable height uniformity or coplanarity. As a result, in the subsequent, when a chip (not shown) is electrically connected onto the first conductive towers 162a of the carrier substrate 100a of the present embodiment, or a package body (not shown) is electrically connected onto the second conductive towers 164a, the first conductive towers 162a and the chip, or the second conductive towers 164a and the package body, may have a favorable joining reliability therebetween.

Figure 3J:
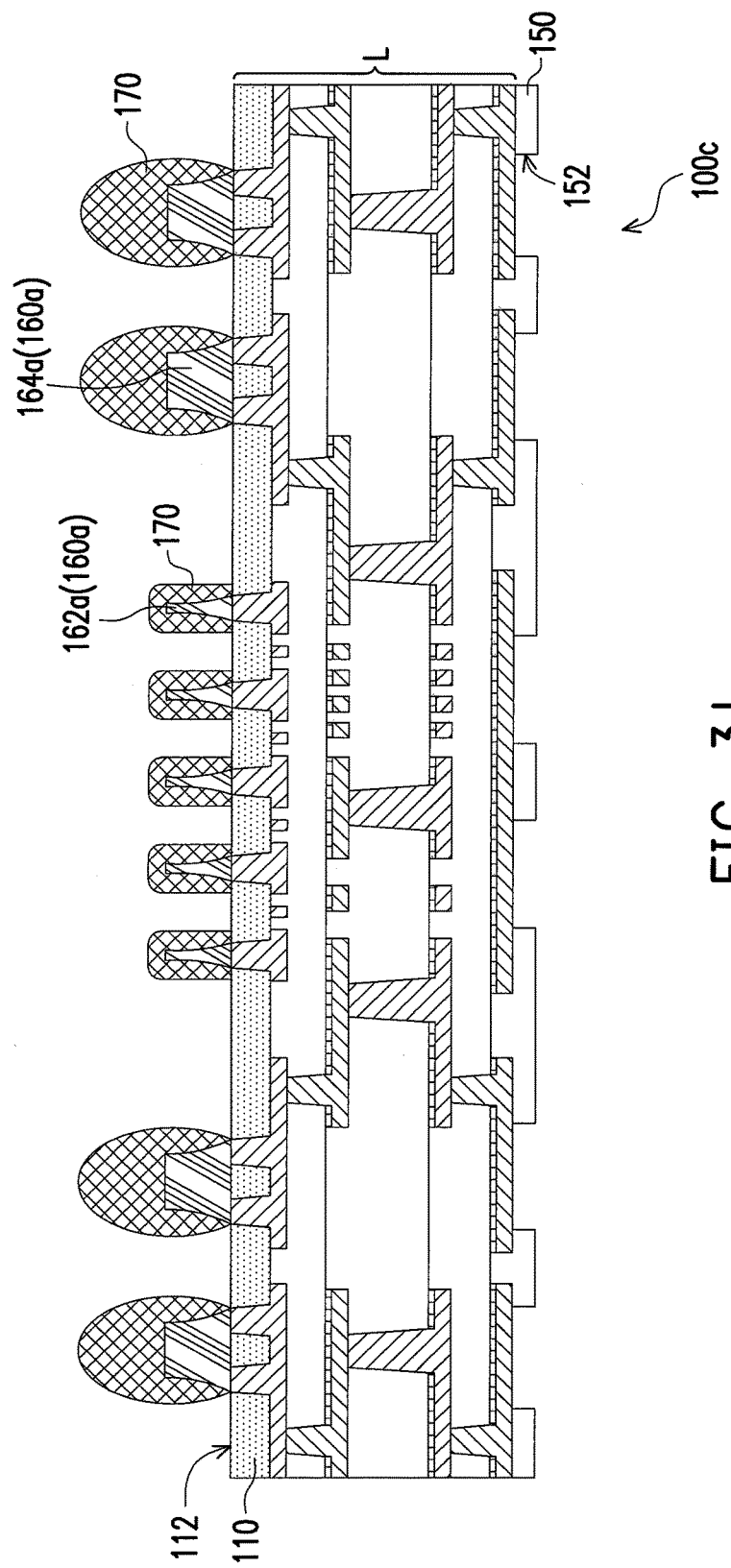

Referring to FIG. 3J, after the step of removing the patterned dry film M as illustrated in FIG. 3I, a plurality of solders 170 are further formed on the first conductive towers 162a and the second conductive towers 164a, wherein the solders 170 respectively cover the first conductive towers 162a and the second conductive towers 164a. In the present embodiment, a material of the solders 170 includes tin/silver/copper alloy or tin/copper alloy. At this point, the manufacture of the carrier substrate 100c is completed.

Since the conductive towers 160a of the present embodiment are formed by etching the second copper foil layers 24 (referring to FIG. 3H), the cross-sectional profiles of the conductive towers 160a have concave curved surfaces, viz., the diameter of each of the conductive towers 160a gradually increases from the top surface 161a towards the bottom surface 163a, and may result in larger contact areas and soldering spaces. As such, the solders 170 formed on the conductive towers 160a may have favorable joining forces.

Figure 4A:
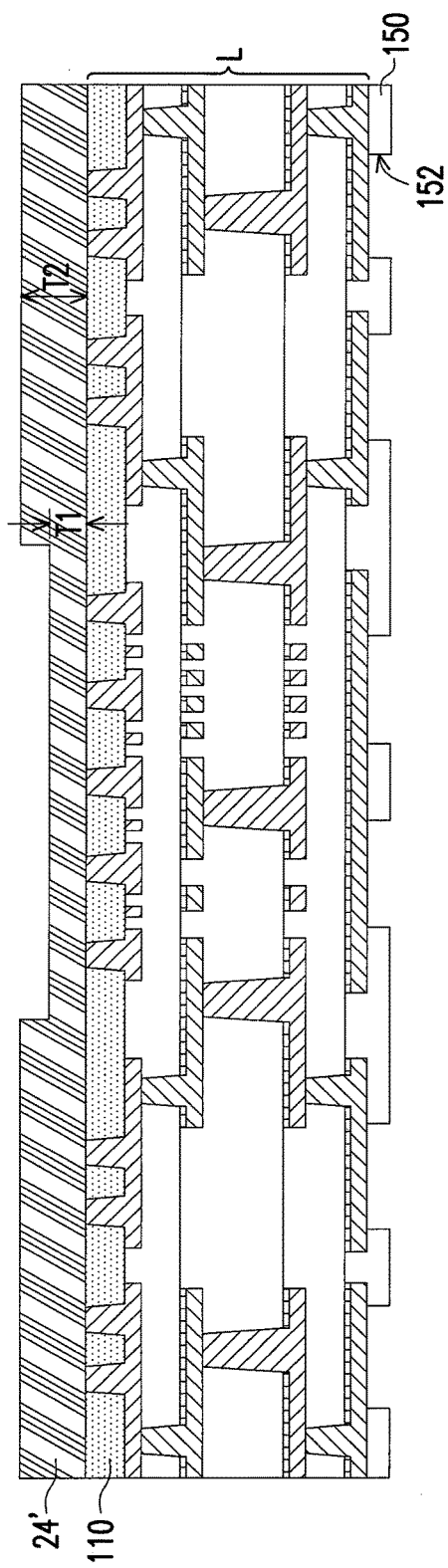
FIG. 4A through FIG. 4C are schematic cross-sectional views illustrating the partial steps of a manufacturing method of a carrier substrate according to another embodiment of the invention.
Figure 4B:
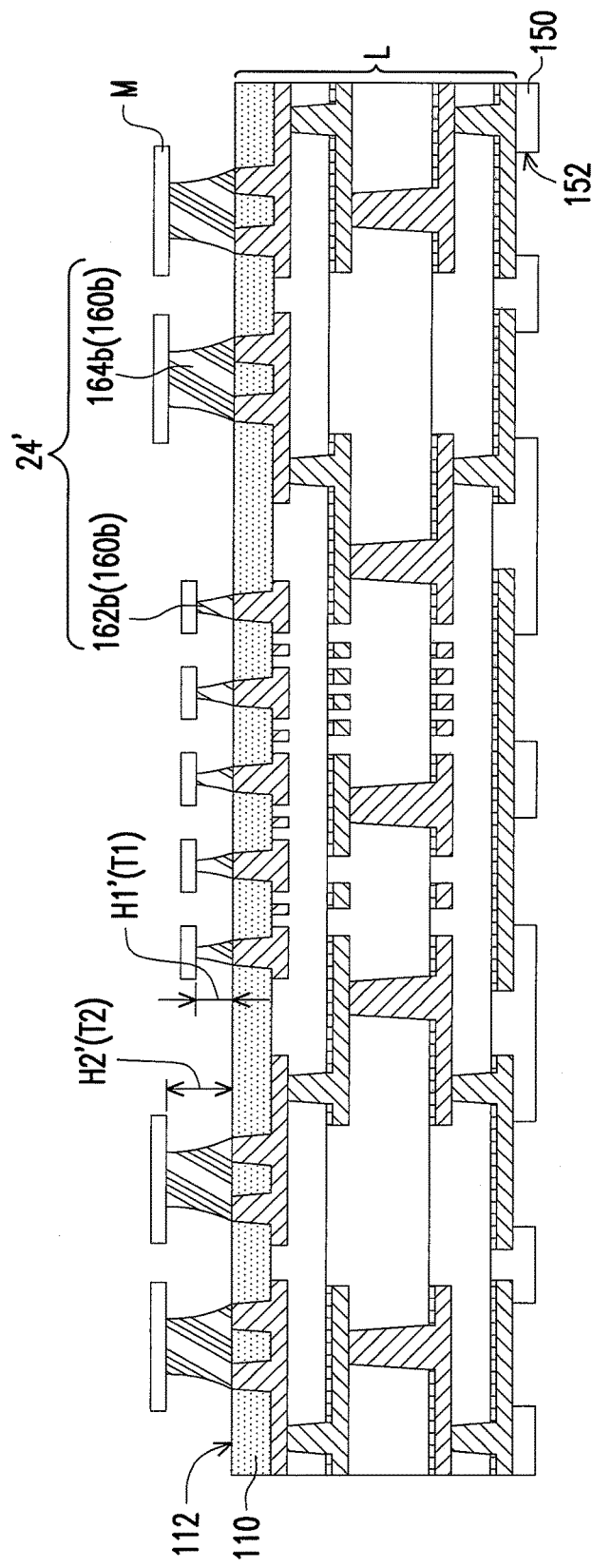
Figure 4C:
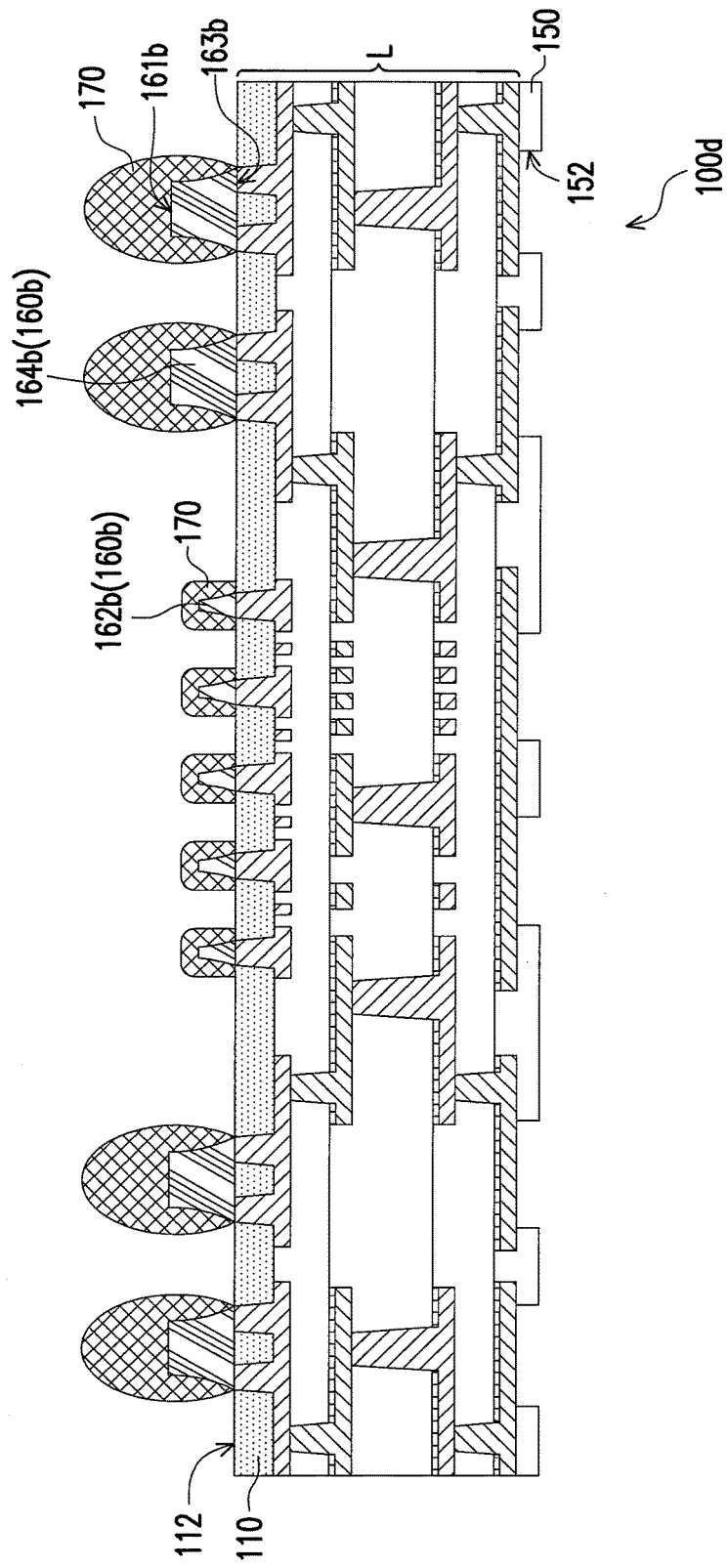

FIG. 4A through FIG. 4C are schematic cross-sectional views illustrating the partial steps of a manufacturing method of a carrier substrate according to another embodiment of the invention. The present embodiment has adopted component notations and part of the contents from the previous embodiments, wherein the same notations are used for representing the same or similar components, and descriptions of the same technical contents are omitted. The descriptions regarding to the omitted part may be referred to the previous embodiments, and thus is not repeated herein.

After removing the first copper foil layers 22, the release layers 26 and the core dielectric layer 10 as illustrated in FIG. 3G, and before forming the patterned dry film M as illustrated in FIG. 3H, a portion of the second copper foil layer 24 is removed, so that a second copper foil layer 24' has a first thickness T1 and a second thickness T2, wherein the second thickness T2 is greater than the first thickness T1, as referring to FIG. 4A.

Next, referring to FIG. 4B, a patterned dry film M is formed on the exposed second copper foil layer 24'. Next, by using the patterned dry film M as an etching mask, the second copper foil layer 24' is etched to form the conductive towers 160b, wherein the conductive towers 160b are formed on the first surface 112 of the insulation layer 110. In the present embodiment, the conductive towers 160b include the first conductive towers 162b and the second conductive towers 164b surrounding the first conductive towers 162b. Herein, a height H1' of the first conductive towers 162b is equal to the first thickness T1, and a height H2' of the second conductive towers 164b的 height H2' is equal to the second thickness T2.

Afterward, referring to FIG. 4B and FIG. 4C at the same time, the patterned dry film M is removed to expose top surfaces 161b of the conductive towers 160b, and hereby the manufacturing of the carrier substrate 100b illustrated in FIG. 1B is completed. In addition, in other not shown embodiments, a surface treatment layer may also be formed on the surfaces of the conductive towers.

Finally, referring to FIG. 4C again, the solders 170 are formed on the first conductive towers 162b and the second conductive towers 164b, wherein the solders 170 respectively cover the first conductive towers 162b and the second conductive towers 164b. In the present embodiment, the material of the solders 170 includes tin/silver/copper alloy or tin/copper alloy. At this point, the manufacturing of the carrier substrate 100d is completed.

Since the conductive towers 160b of the present embodiment is formed by etching the second copper foil layer 24' with uniform first thickness T1 and uniform second thickness T2, instead of being formed by using the conventionally known electroplating process, and the second copper foil layer 24' itself has a favorable uniformity in thickness, in the present embodiment, the height H1' of first conductive towers 162b and the height H2 of the second conductive towers 164b may both have a favorable uniformity or favorable coplanarity. In addition, since the conductive towers 160b of the present embodiment are formed by etching process, the cross-sectional profiles of the conductive towers 160b have concave curved surfaces; viz., the diameter of each of the conductive towers 160b gradually increases from the top surface 161b towards the bottom surface 163b, and may result in larger contact areas. As such, the solders 170 formed on the conductive towers 160b may have favorable joining forces.

Figure 5A:
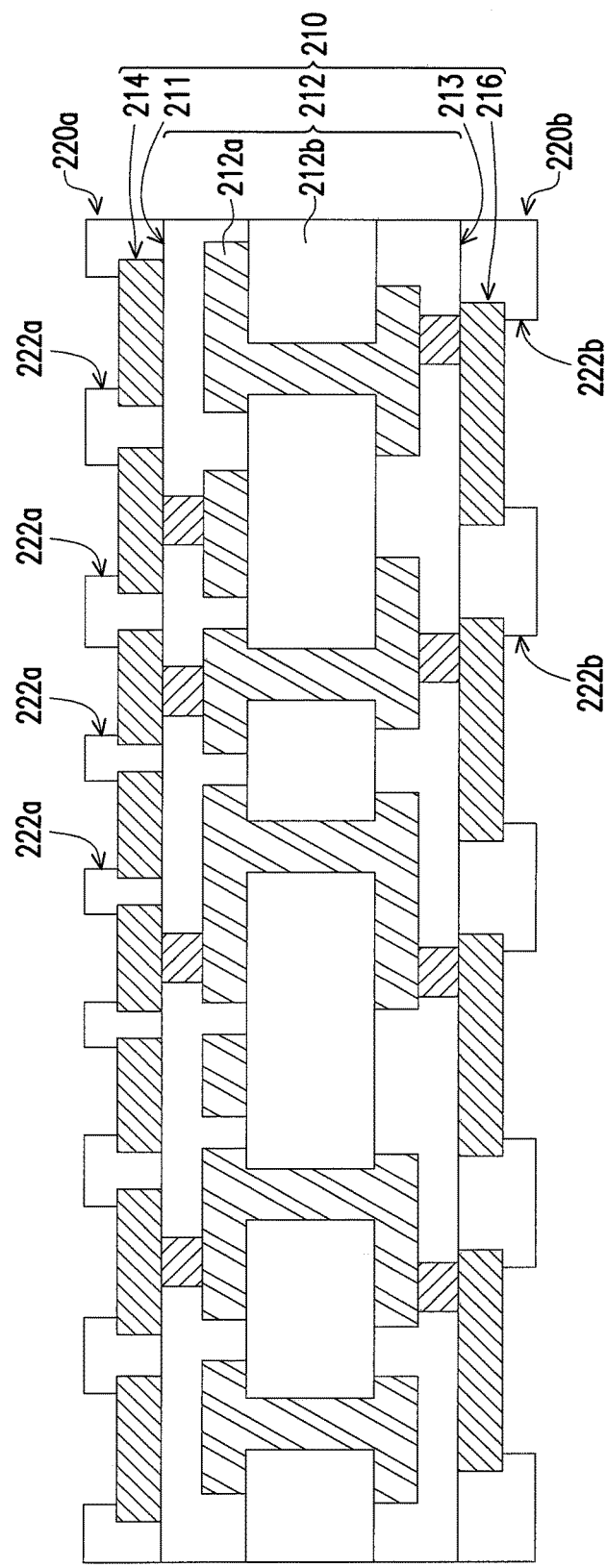

FIG. 5A through FIG. 5J are schematic cross-sectional views illustrating the steps of a manufacturing method of a carrier substrate according to yet another embodiment of the invention. Referring to FIG. 5A, according to the manufacturing method of the carrier substrate 200a of the present embodiment, firstly, a circuit structure layer 210 is provided. Specifically, the circuit structure layer 210 includes a core structure layer 212, a first circuit layer 214 and a second circuit layer 216. The core structure layer 210 has an upper surface 211 and a lower surface 213 relative to each other. The first circuit layer 214 is disposed on the upper surface 211 and exposes part of the upper surface 211. The second circuit layer 216 is disposed on the lower surface 213 and exposes part of the lower surface 213. The core structure layer 212 shown in FIG. 5A is only to be taken as an example, and is in a form of having inner layer circuits 212a and core dielectric layers 212b, but the embodiment is not limited thereto.

Next, referring to FIG. 5A again, a first solder resist layer 220a and a second solder resist layer 220b are respectively formed on the first circuit layer 214 as well as the upper surface 211 exposed by the first circuit layer 214, and the second circuit layer 216 as well as the lower surface 213 exposed by the second circuit layer 216. In the present embodiment, first solder resist layer 220a has a plurality of first openings 222a exposing parts of the first circuit layer 214, and the second solder resist layer 220b has a plurality of second openings 222b exposing parts of the second circuit layer 216.

Figure 5B:
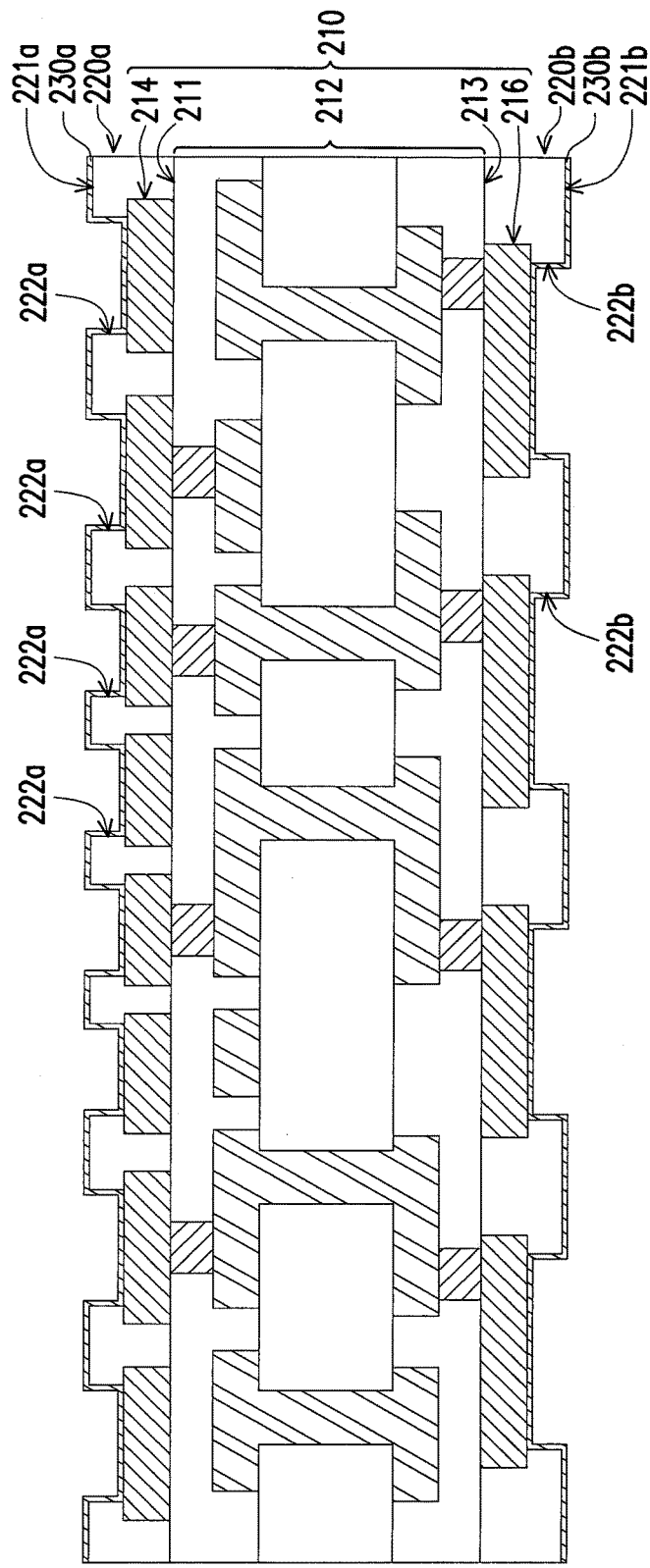

Next, referring to FIG. 5B, seed layers 230a and 230b are respectively formed on the first solder resist layer 220a and the second solder resist layer 220b. The seed layers 230a and 230b respectively cover a first surface 221a of the first solder resist layer 220a and a second surface 221b of the second solder resist layer 220b, inner walls of the first openings 222a and inner walls of the second openings 222b, and cover the first circuit layer 214 exposed by the first openings 222a of the first solder resist layer 220a and the second circuit layer 216 exposed by the second openings 222b of the second solder resist layer 220b.

Figure 5C:
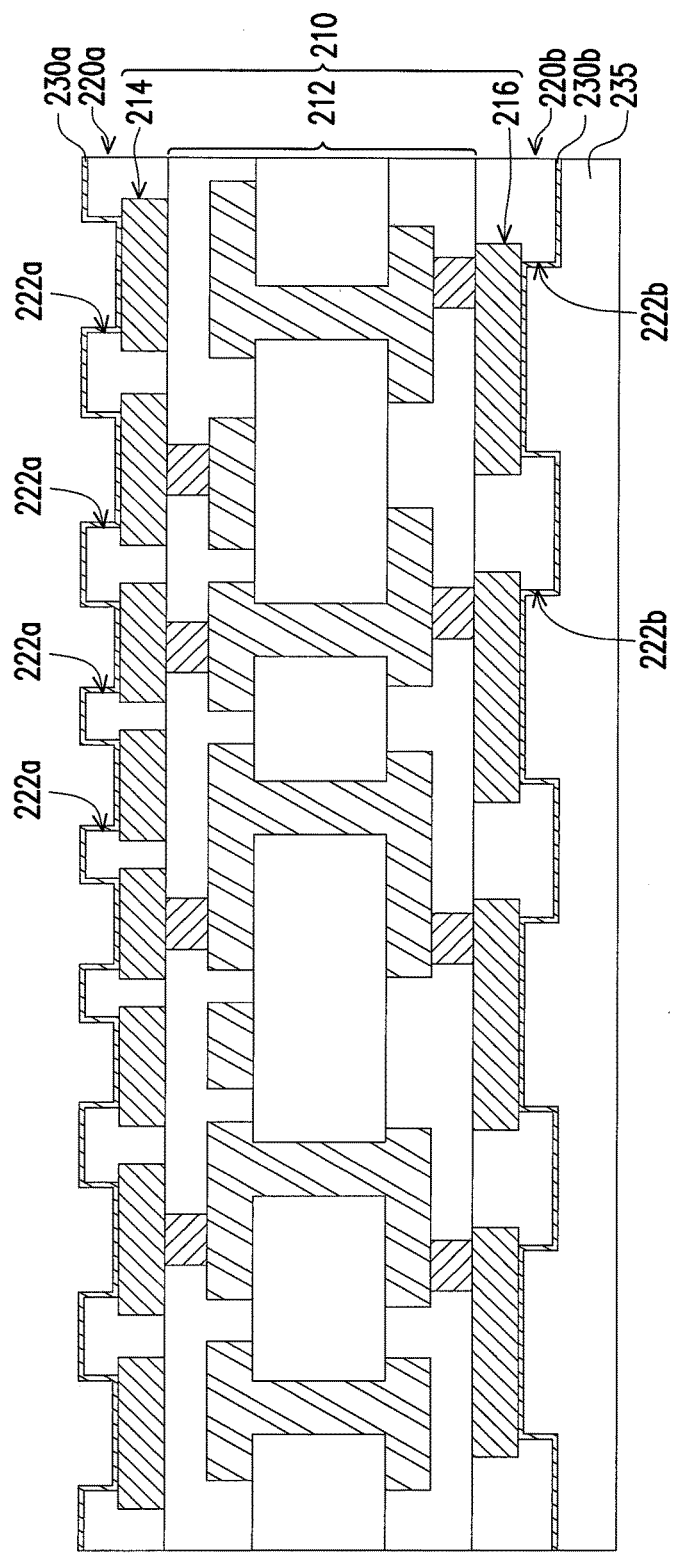

Next, referring to FIG. 5C, a barrier layer 235 is formed on the seed layer 230b located on the second solder resist layer 220b. In the present embodiment, the barrier layer 235 covers the seed layer 230b located on the second circuit layer 216 exposed by the second openings 222b and on the second solder resist layer 220b.

Figure 5D:
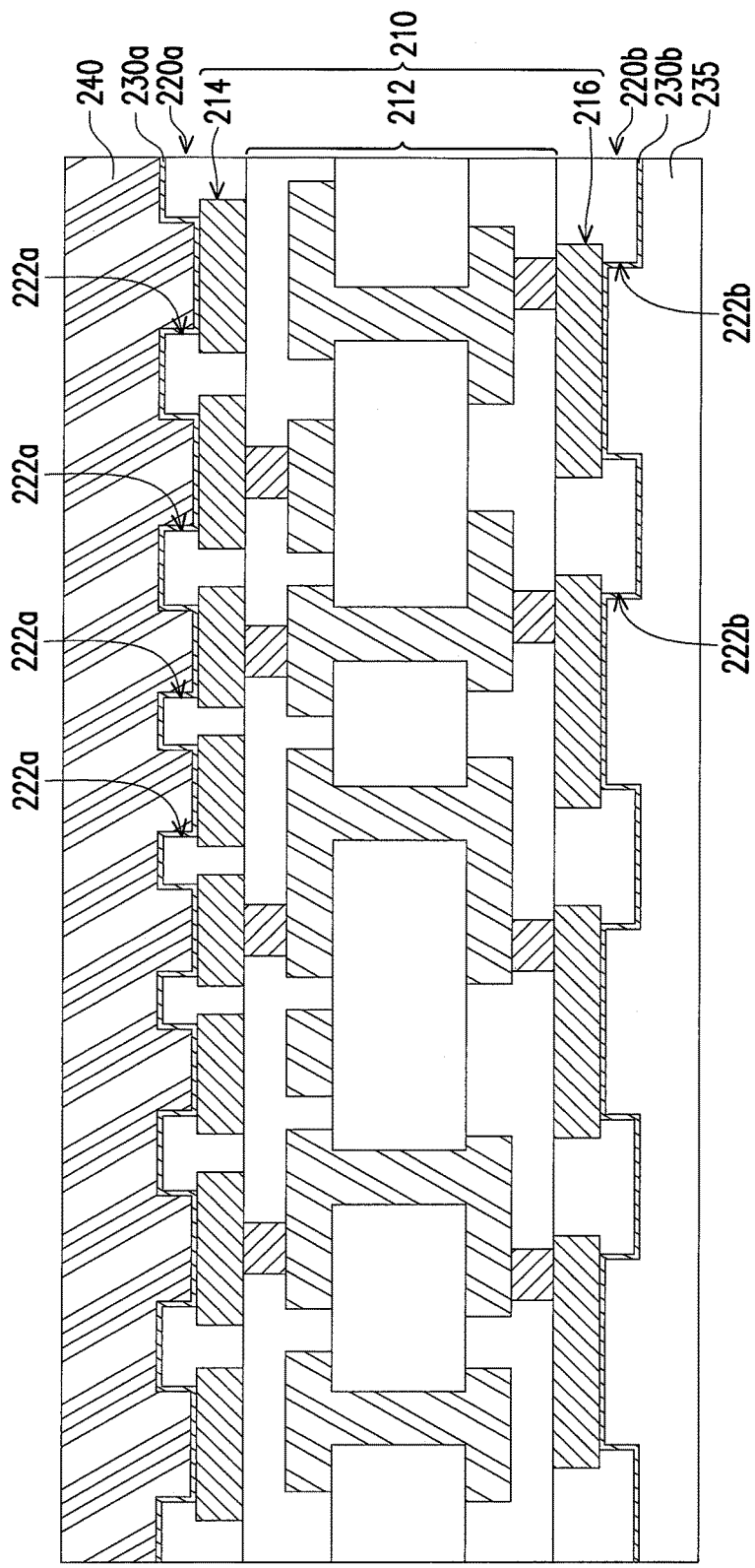

Next, referring to FIG. 5D, after the barrier layer 235 is formed, an entire cover of metal layer 240 is formed on the seed layer 230a located on the first solder resist layer 220a. In the present embodiment, the seed layer 230a may be regarded as a conductive pathway for the electroplating, and the entire cover of metal layer 240 is formed using this seed layer 230a via a manner of panel plating. As shown in FIG. 5D, the entire cover of metal layer 240 substantially has a favorable uniformity in thickness and is an entire cover of structure layer, instead of a patterned structure layer. Herein, the entire cover of metal layer 240 completely covers the first circuit layer 214 exposed by the first openings 222a and the seed layer 230a located on the first solder resist layer 220a.

Figure 5E:
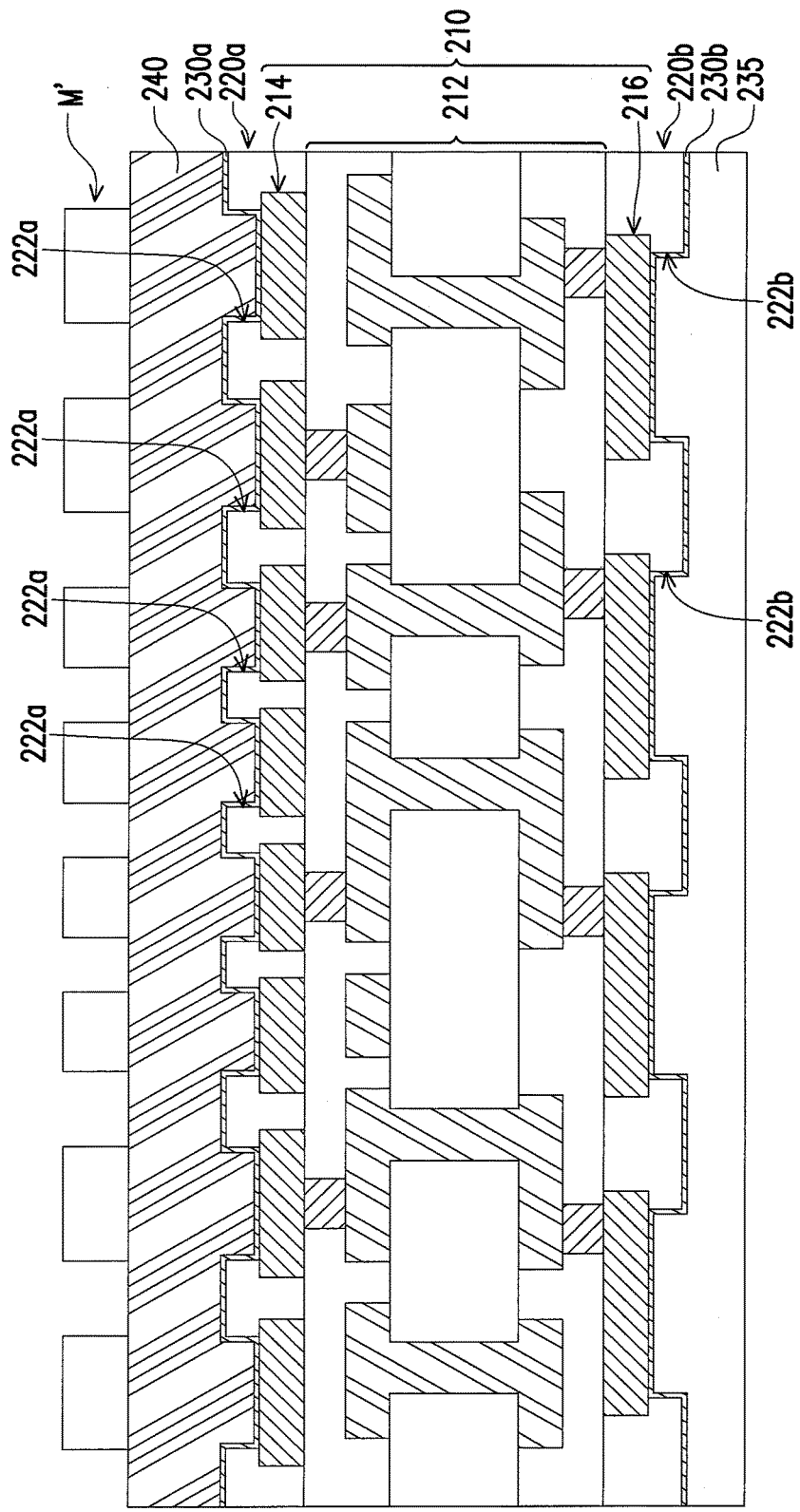

Next, referring to FIG. 5E, a patterned dry film M' is formed on the entire cover of metal layer 240, wherein the patterned dry film M' exposes parts of the entire cover of metal layer 240.

Figure 5F:
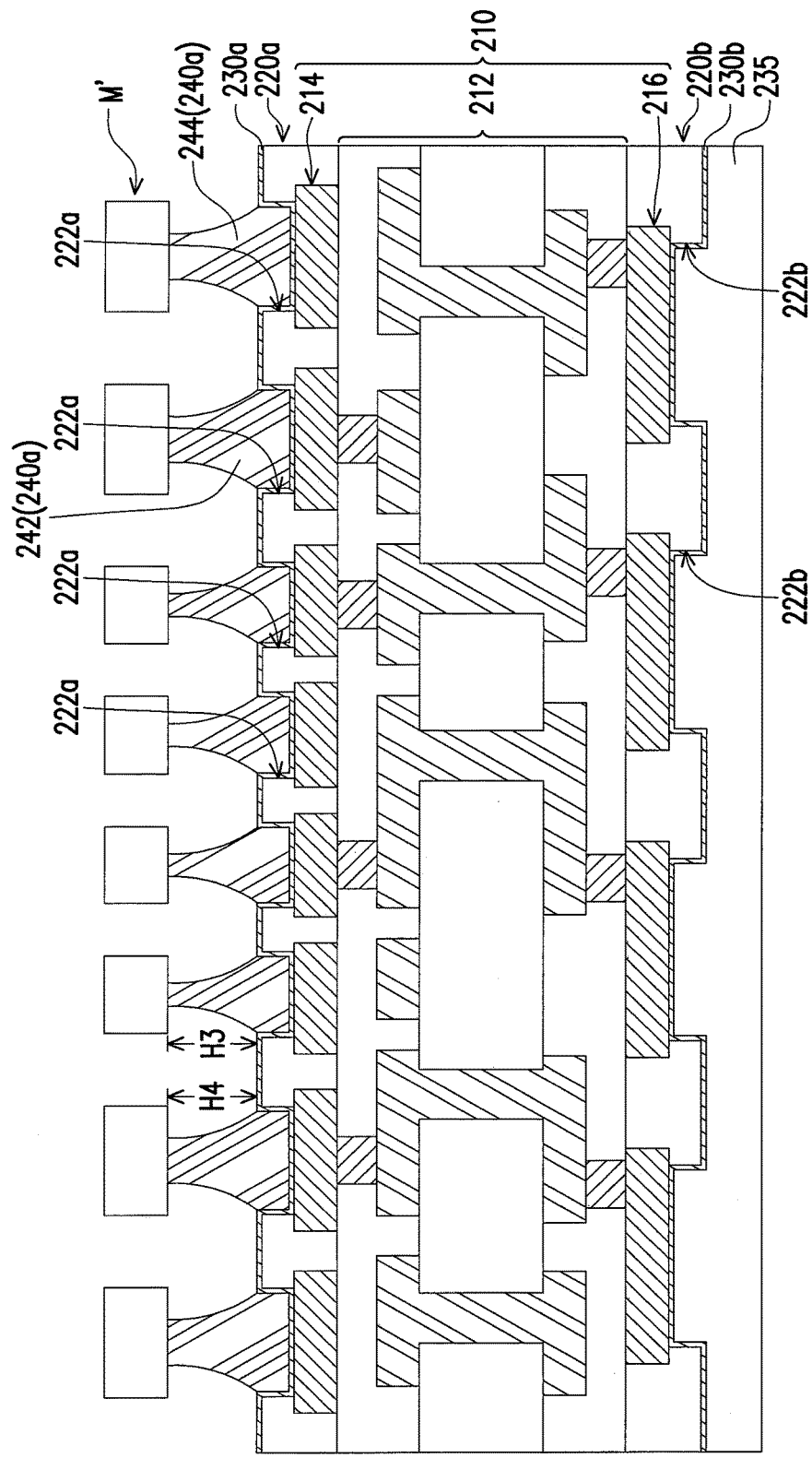

Next, referring to FIG. 5F, by using the patterned dry film M' as an etching mask, the entire cover of metal layer 240 is etched to form the conductive towers 240a. In detail, the conductive towers 240a are formed at the first openings 222a of the first solder resist layer 220a and higher than a surface of the first solder resist layer 220a. The conductive towers 240a are structurally and electrically connected to the first circuit layer 214 exposed by the first openings 222a. In particular, a diameter of each of the conductive towers 240a gradually increases by a direction from away-from the first openings 222a towards close-to the first openings 222a. In the present embodiment, the conductive towers 240a includes a plurality of first conductive towers 242 and a plurality of second conductive towers 244 surrounding the first conductive towers 242, a diameter of the second conductive towers 244 is greater than a diameter of the first conductive towers 242, and a height H3 of the first conductive towers 242 is substantially the same as a height H4 of the second conductive towers 244.

Figure 5G:
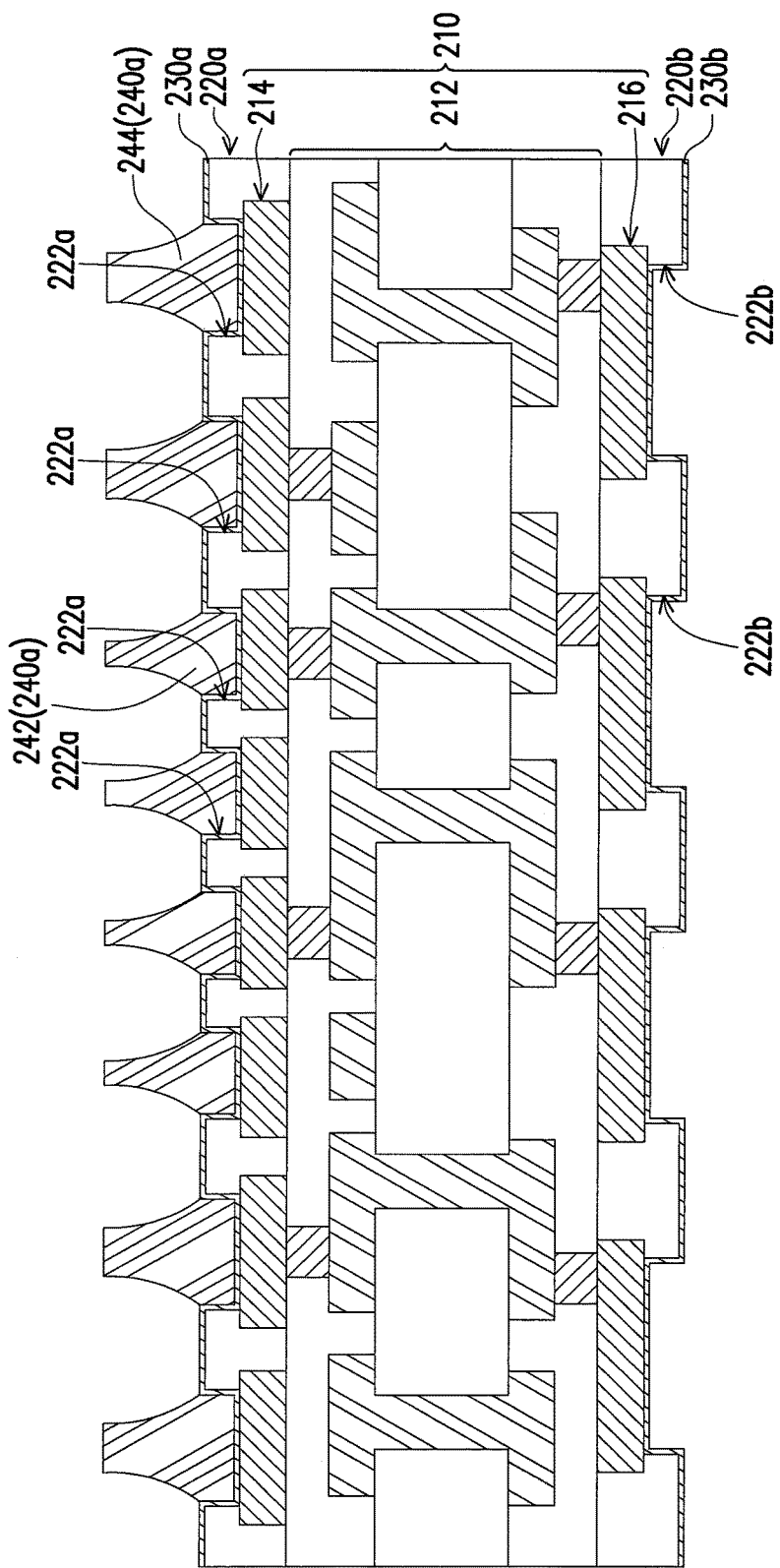

Afterward, referring to FIG. 5F and FIG. 5G, the patterned dry film M' and the barrier layer 235 are removed to expose the conductive towers 240a, the seed layers 230a and 230b and the second circuit layer 216 exposed by the second openings 222b of the second solder resist layer 220b.

Figure 5H:
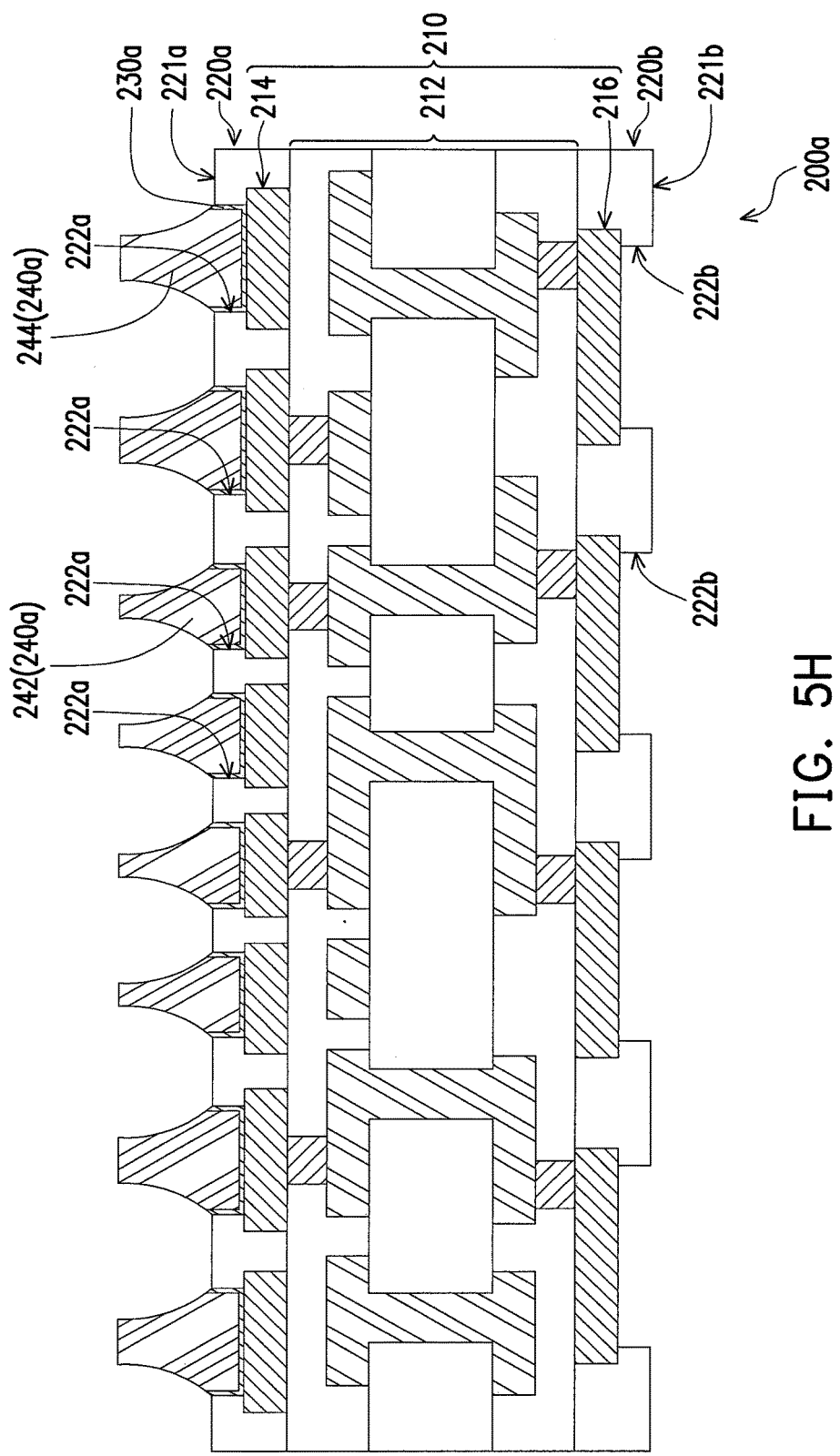

Finally, referring to FIG. 5H, the seed layer 230a located on the first surface 221a of the first solder resist layer 220a and the seed layer 230b located on the second surface 221b of the second solder resist layer 220b are removed. Herein, only parts of the seed layer 230a located between the conductive towers 240a and the first openings 222a are remained. At this point, the manufacturing of the carrier substrate 200a is completed.

In another embodiment, the aforementioned manufacturing method further includes the following steps. Before forming the patterned dry film M' illustrated in FIG. 5E, a portion of the entire cover of metal layer 240 is removed, so that the entire cover of metal layer 240 has a first thickness and a second thickness, wherein the second thickness is greater than the first thickness. Next, through the steps sequentially illustrated in FIG. 5E and FIG. 5F, when forming the conductive towers 240', a height H5 of the first conductive towers 242' is equal to the first thickness, and a height H6 of the second conductive towers 244' is equal to the second thickness, as referring to FIG. 2B.

Since, in the present embodiment, the entire cover of metal layer 240 with the favorable uniformity in thickness and of being an entire cover of structure layer is formed by using the seed layer 230a as an electroplating seed layer and by using the seed layer 230a to perform the panel plating process, and in afterward, the entire cover of metal layer 240 is etched to form the conductive towers 240a, then as in relative to the copper pillars formed by the conventionally known electroplating process, the height of the conductive towers 240a formed in the present embodiment may have a favorable height uniformity or coplanarity. As result, in the subsequent, when a chip (not shown) is electrically connected onto the first conductive towers 242 of the carrier substrate 200a of the present embodiment, or a package body (not shown) is electrically connected onto the second conductive towers 244, the first conductive towers 242 and the chip, or the second conductive towers 244 and the package body, may have a favorable joining reliability therebetween.

Figure 5I:
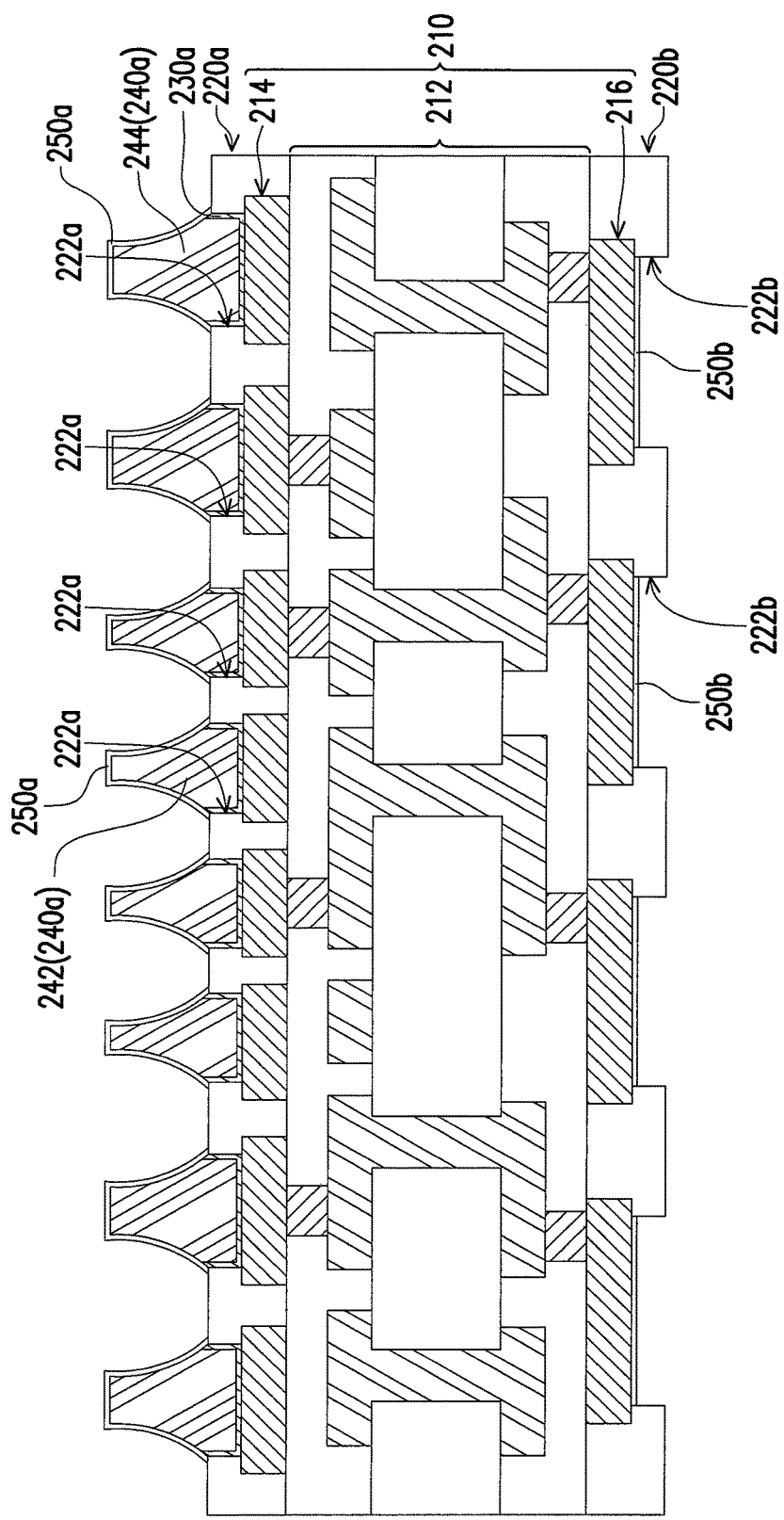

After the step illustrated in FIG. 5H, referring to FIG. 5I, a first surface treatment layer 250a may further be formed on the surfaces of the conductive towers 240a, and a second surface treatment layer 250b may further be formed on the second circuit layer 216 exposed by the second openings 222b of the second solder resist layer 220b. In the present embodiment, a material of the first surface treatment layer 250a and a material of the second surface treatment layer 250b, for example, are organic solderability preservatives (OSP), electroless nickel electroless palladium immersion gold (ENEPIG) or other proper materials.

Afterward, referring to FIG. 5J, after forming the first surface treatment layer 250a, a plurality of solders 260a is formed to cover the conductive towers 240a, wherein a material of the solders 260a includes tin/silver/copper alloy or tin/copper alloy. Herein, the solders 260a cover the first conductive towers 242 and the second conductive towers 244. At this point, the manufacturing of the carrier substrate 200b is completed.

Since the surfaces of the conductive towers 240a of the present embodiment and the surface of the second circuit layer 216 exposed by the second openings 222b of the second solder resist layer 220b are all disposed with the first surface treatment layer 250a and the second surface treatment layer 250b thereon, the conductive towers 240a and the second circuit layer 216 may be avoid from being oxidized, so as to maintain electrical performances of the conductive towers 240a and the second circuit layer 216.

Figure 6A:
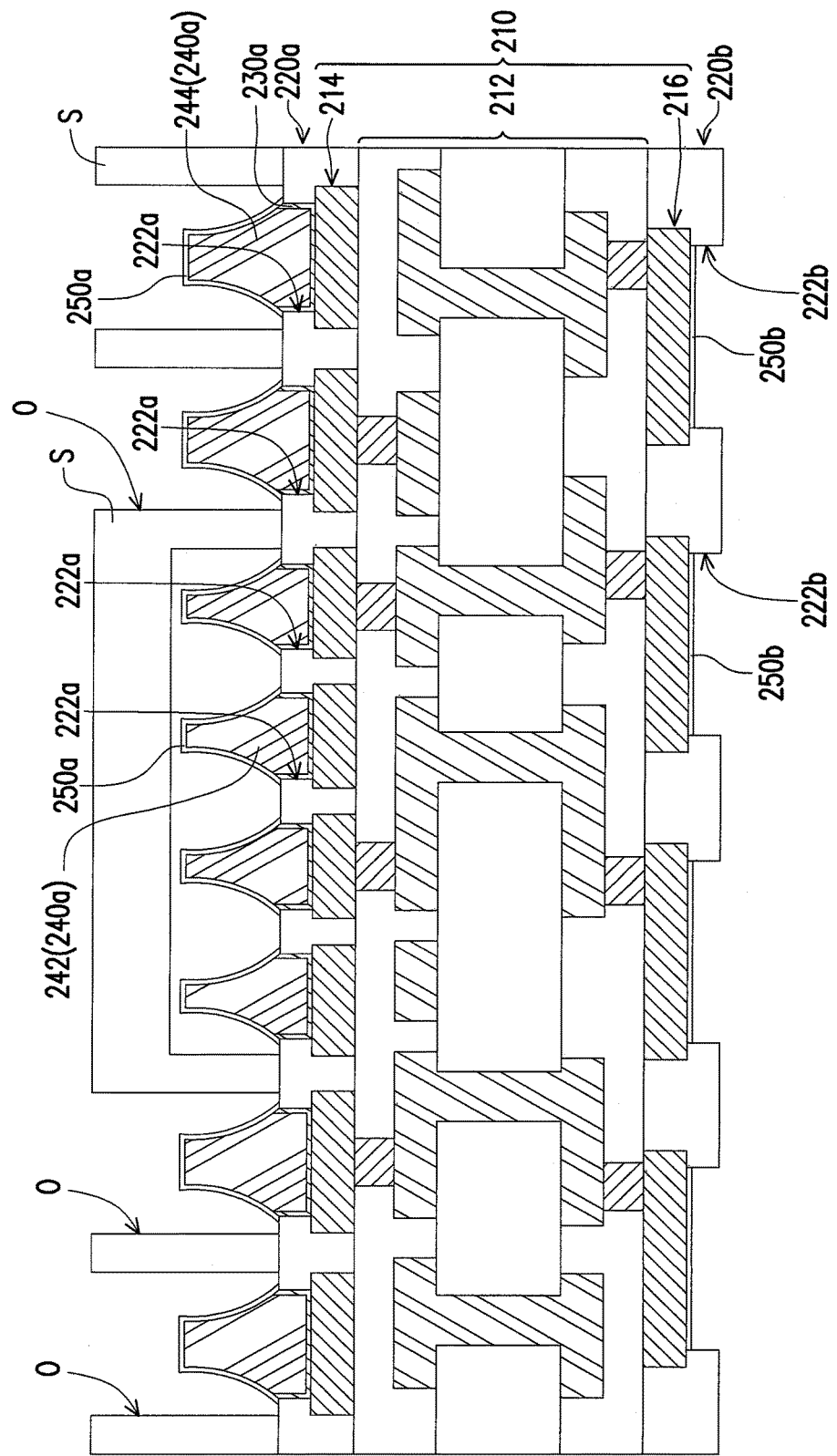
FIG. 6A through FIG. 6B are schematic cross-sectional views illustrating the partial steps of a manufacturing method of a carrier substrate according to still another embodiment of the invention.
Figure 6B:
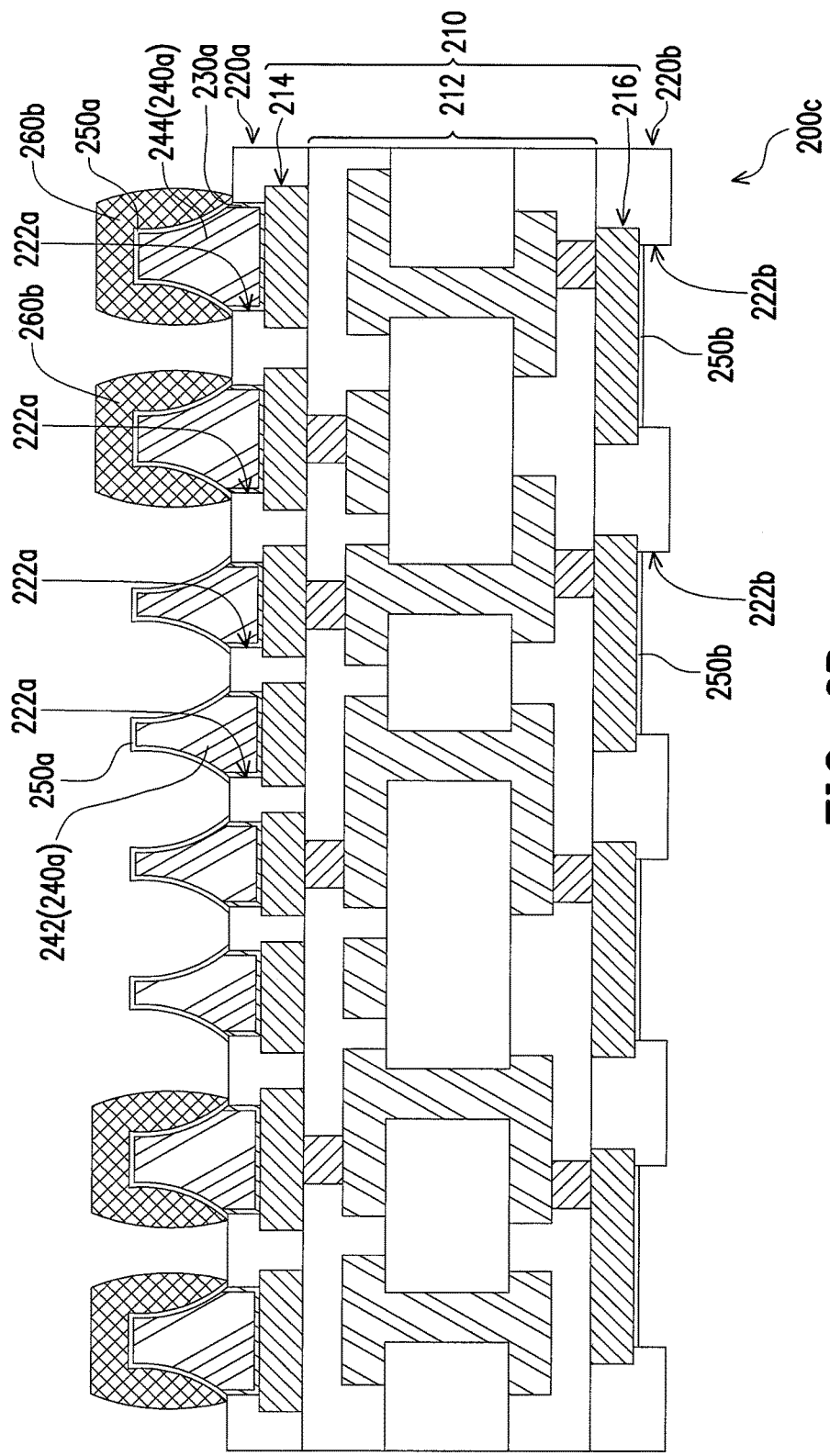

FIG. 6A through FIG. 6B are schematic cross-sectional views illustrating the partial steps of a manufacturing method of a carrier substrate according to still another embodiment of the invention. The present embodiment has adopted component notations and part of the contents from the previous embodiments, wherein the same notations are used for representing the same or similar components, and descriptions of the same technical contents are omitted. The descriptions regarding to the omitted part may be referred to the previous embodiments, and thus is not repeated herein.

Referring to FIG. 6A, after the step of forming the first surface treatment layer 250a and the second surface treatment layer 250b illustrated in FIG. 5I, a steel plate S is disposed on the first solder resist layer 220a. In the present embodiment, the steel plate S completely covers the first conductive towers 242 and has a plurality of openings O, wherein the openings O expose the second conductive towers 244.

Afterward, referring to FIG. 6A and FIG. 6B at the same time, a plurality of solders 260b is formed in the openings O of the steel plate S to at least cover the conductive towers 240a, wherein a material of the solders 260b includes tin/silver/copper alloy or tin/copper alloy. Herein, the solders 260b only cover the second conductive towers 244.

Finally, referring to FIG. 6B again, the steel plate S is removed to expose the first conductive towers 242. At this point, the manufacturing of the carrier substrate 200b is completed.

Since the conductive towers 240b of the present embodiment are formed by etching the entire cover of metal layer 240 with the favorable uniformity in thickness (referring to FIG. 5E), the cross-sectional profiles of the conductive towers 240b have concave curved surfaces, and may result in larger contact areas and soldering spaces. As such, the solders 260b formed on the conductive towers 240b may have favorable joining forces. Furthermore, since the conductive towers 240b are higher than the surface of the first solder resist layer 220a, an amount of time for attaching the solders 260b to the conductive towers 240b may be shortened and a possibility of the solders 260b being detached from the conductive towers 240b may be reduced.

In summary, since the conductive towers of one embodiment of the invention are formed by etching the second copper foil layer, instead of being formed by using the conventionally known electroplating process, and the second copper foil layer itself has the favorable uniformity in thickness, then as in relative to the copper pillars formed by the conventionally known electroplating process, the height of the conductive towers formed by the invention may have the more favorable height uniformity or coplanarity. Furthermore, in another embodiment, since the entire cover of metal layer with the favorable uniformity in thickness and of being the entire cover of structure layer is formed by using the seed layer as the electroplating seed layer and by using the seed layer to perform the panel plating process, and in afterward, the conductive towers are formed by etching this conductive layer, then as in relative to the copper pillars formed by the conventionally known electroplating process, the height of the conductive towers formed by the invention may have the more favorable height uniformity or coplanarity. As a result, in the subsequent, when the chip/package body is electrically connected onto the conductive towers of the carrier substrate of the invention, the conductive towers and the chip and/or the package body may have the favorable joining reliability therebetween.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A carrier substrate, comprising:
an insulation layer having a first surface and a second surface relative to each other and a plurality of first openings extending from the first surface to the second surface, wherein an aperture of each of the first openings gradually increases from the first surface of the insulation layer towards the second surface;
a plurality of conductive towers disposed on the first surface of the insulation layer, each of the conductive towers having a top surface and a bottom surface relative to each other, and a diameter of each of the conductive towers gradually increasing from the top surface towards the bottom surface, wherein the conductive towers comprise a plurality of first conductive towers and a plurality of second conductive towers surrounding the first conductive towers, and a diameter of the second conductive towers is greater than a diameter of the first conductive towers, wherein all portions of a side surface of each of the conductive towers are completely exposed; and
a circuit structure layer disposed on the second surface of the insulation layer and comprising at least one dielectric layer, at least two circuit layers and a plurality of conductive vias, wherein the dielectric layer and the circuit layers are alternately stacked, one of the circuit layers is disposed on the second surface of the insulation layer, the conductive vias comprise a plurality of first conductive vias extending from the circuit layers, disposed in the first openings and extending to the conductive towers, the conductive vias further comprise a plurality of second conductive vias passing through the dielectric layer and electrically connecting the circuit layers, a diameter of the first conductive vias gradually increases from the first surface of the insulation ayer towards the second surface, each of the second conductive towers correspondingly connects to at least two of the first conductive vias, and each of the first conductive towers correspondingly connects to one of the first conductive vias, wherein an interface exists between the first conductive vias and the first conductive towers as well as the second conductive towers, and cross-sectional profiles of the first conductive towers and the second conductive towers are concave shaped, and cross-sectional profiles of the first conductive vias are flat shaped.

2. The carrier substrate as recited in claim 1, wherein a height of the first conductive towers is equal to or lower than a height of the second conductive towers.

* * * * *